(12) United States Patent
Maros et al.

(10) Patent No.: US 10,991,835 B2
(45) Date of Patent: Apr. 27, 2021

(54) HYDROGEN DIFFUSION BARRIER FOR HYBRID SEMICONDUCTOR GROWTH

(71) Applicant: ARRAY PHOTONICS, INC., Tempe, AZ (US)

(72) Inventors: Aymeric Maros, San Francisco, CA (US); Ferran Suarez, Chandler, AZ (US); Jacob Thorp, Phoenix, AZ (US); Michael Sheldon, Marana, AZ (US); Ting Liu, San Jose, CA (US)

(73) Assignee: ARRAY PHOTONICS, INC., Tempe, AZ (US)

( * ) Notice: Subject to any disclaimer, the term of this patent is extended or adjusted under 35 U.S.C. 154(b) by 0 days.

(21) Appl. No.: 16/535,874

(22) Filed: Aug. 8, 2019

(65) Prior Publication Data

US 2020/0052137 A1 Feb. 13, 2020

Related U.S. Application Data

(60) Provisional application No. 62/716,814, filed on Aug. 9, 2018.

(51) Int. Cl.
*H01L 31/0304* (2006.01)
*H01L 31/02* (2006.01)
(Continued)

(52) U.S. Cl.
CPC .. *H01L 31/03048* (2013.01); *H01L 31/02021* (2013.01); *H01L 31/02327* (2013.01); *H01L 31/03042* (2013.01); *H01L 31/0725* (2013.01); *H01L 31/1848* (2013.01); *H01L 33/0075* (2013.01); *H01L 33/06* (2013.01); *H01L 33/10* (2013.01); *H01L 33/12* (2013.01);
(Continued)

(58) Field of Classification Search
None
See application file for complete search history.

(56) References Cited

U.S. PATENT DOCUMENTS 4,835,116 A 5/1989 Lee et al.
5,376,185 A 12/1994 Wanlass
(Continued)

FOREIGN PATENT DOCUMENTS

CA 2639902 A1 3/2010
GB 2555409 A 5/2018
(Continued)

OTHER PUBLICATIONS

Non-Final Office Action for U.S. Appl. No. 15/660,471, dated Mar. 20, 2020, 10 pages.
(Continued)

*Primary Examiner* — Evren Seven
(74) *Attorney, Agent, or Firm* — Morrison & Foerster LLP

(57) ABSTRACT

Semiconductor devices and methods of fabricating semiconductor devices having a dilute nitride active layer and at least one semiconductor material overlying the dilute nitride active layer are disclosed. Hybrid epitaxial growth and the use of hydrogen diffusion barrier layers to minimize hydrogen diffusion into the dilute nitride active layer are used to fabricate high-efficiency multijunction solar cells and photonic devices. Hydrogen diffusion barriers can be formed through the use of layer thickness, composition, doping and/or strain.

16 Claims, 15 Drawing Sheets

| Layer Name | Layer Function | |
|---|---|---|
| InGaAs | InGaAs Contact | 536 |
| InAlP | FSF (Front Surface Field) | 534 |
| AlGaInP | Emitter | 532 |
| AlGaInP | Base | 530 |
| AlGaInP | BSF (Back Surface Field) | 528 |
| AlGaAs | Tunnel Junction | 526 |
| GaAs | Tunnel Junction | |
| AlGaInP | FSF (Front Surface Field) | 524 |
| AlGaAs | Emitter | 522 |
| AlGaAs | Base | 520 |
| AlGaAs | BSF (Back Surface Field) | 518 |
| InGaAs | Tunnel Junction and Protective Cap Layer | 516 |
| InGaAs | Tunnel Junction | |
| Hydrogen Barrier | Emitter/H-Diffusion Barrier Region | 515 |
| GaInNAsSb | Base | 512B |
| GaInNAsSb | Base | 512A |
| InGaAs | BSF (Back Surface Field) | 510 |
| InGaAs | Tunnel Junction 508B | 508 |
| InGaAs | Tunnel Junction 508A | |
| InGaAs | Buffer Layer | 506 |
| InGaP, InGaPSb, InAlP or AlP/InAlP | Nucleation Layer | 504 |
| (Se,Sn) Ge | Substrate, Base | 502 |

(51) Int. Cl.
| | |
|---|---|
| H01L 31/0232 | (2014.01) |
| H01L 31/0725 | (2012.01) |
| H01L 31/18 | (2006.01) |
| H01L 33/00 | (2010.01) |
| H01L 33/06 | (2010.01) |
| H01L 33/10 | (2010.01) |
| H01L 33/12 | (2010.01) |
| H01L 33/32 | (2010.01) |
| H01L 33/46 | (2010.01) |
| H01L 33/60 | (2010.01) |
| H01S 5/183 | (2006.01) |
| H01S 5/30 | (2006.01) |

(52) U.S. Cl.
CPC ............ *H01L 33/325* (2013.01); *H01L 33/46* (2013.01); *H01L 33/60* (2013.01); *H01S 5/183* (2013.01); *H01S 5/3013* (2013.01)

(56) References Cited

U.S. PATENT DOCUMENTS

| | | | |
|---|---|---|---|
| 5,405,453 | A | 4/1995 | Ho et al. |
| 5,853,497 | A | 12/1998 | Lillington et al. |
| 5,911,839 | A | 1/1999 | Tsai et al. |
| 5,944,913 | A | 8/1999 | Hou et al. |
| 6,380,601 | B1 | 4/2002 | Ermer et al. |
| 7,339,109 | B2 | 3/2008 | Stan et al. |
| 7,629,240 | B2 | 12/2009 | Stan et al. |
| 7,872,252 | B2 | 1/2011 | Puetz et al. |
| 8,125,958 | B2 | 2/2012 | Puetz et al. |
| 8,362,460 | B2 | 1/2013 | Puetz et al. |
| 8,859,886 | B2 | 10/2014 | Stan et al. |
| 8,957,306 | B2 | 2/2015 | Stan et al. |
| 2004/0079408 | A1 | 4/2004 | Fetzer et al. |
| 2010/0218813 | A1 | 9/2010 | Guha et al. |
| 2010/0263707 | A1 | 10/2010 | Cheong et al. |
| 2010/0319764 | A1 | 12/2010 | Wiemer et al. |
| 2012/0103403 | A1* | 5/2012 | Misra ............... H01L 31/0735 136/255 |
| 2012/0125418 | A1 | 5/2012 | Puetz et al. |
| 2012/0240987 | A1 | 9/2012 | King et al. |
| 2013/0269760 | A1 | 10/2013 | Mazzer et al. |
| 2014/0116500 | A1 | 5/2014 | Stan et al. |
| 2017/0110613 | A1 | 4/2017 | Suarez et al. |
| 2017/0200849 | A1* | 7/2017 | King ............... H01L 31/03042 |
| 2017/0365732 | A1* | 12/2017 | Liu ............... H01L 31/0687 |

FOREIGN PATENT DOCUMENTS

| | | |
|---|---|---|
| TW | 201246586 A | 11/2012 |
| WO | 2009/009111 A1 | 1/2009 |
| WO | 2012/057874 A1 | 5/2012 |
| WO | 2018/034812 A1 | 2/2018 |

OTHER PUBLICATIONS

Alhomoudi, I. et al., "Optimized Growth of InGaAs/InGaP/Ge Triple-Junction Photovoltaic Structure," 29th European Photovoltaic Solar Energy Conference and Exhibition, 2014, p. 2170-2175.
Armani, N., et al., "Low growth temperature MOCVD InGaP for multi-junction solar cells," E-MRS-Spring Meeting 2015 Symposium C—Advanced inorganic materials and structures for photovoltaics, Energy Procedia, 2015, vol. 84, p. 34-40.
Altieri, P. et al., "Efficiency and Reliability of AlInGaP LEDs grown on Germanium substrates," Proc of SPIE, Light-Emitting Diodes: Research, Manufacturing, and Applications IX, 2005, vol. 5739, p. 93-101.
Barrigon, E., et al., "Reflectance anisotrophy spectroscopy assessment of the MOVPE nucleation of GaInP on germanium (100)," Journal of Crystal Growth, Jan. 2011, vol. 315, Issue 1, p. 22-27.
Barrigon, E., et al., "In situ study of Ge(100) surfaces with tertiarybutylphosphine supply in vapor phase epitaxy ambient," Journal of Crystal Growth, 2013, vol. 370, p. 173-176.
Barrigon, E., et al., "Optical in situ calibration of Sb for growing disordered GaInP by MOVPE," Journal of Crystal Growth, 2015, vol. 426, p. 71-74.
Barrigon, E. et al., "Degradation of Ge subcells by thermal lload during the growth of multijunction solar cells," Progress in Photovoltaics, 2017, p. 1-10.
Barrigon, Enrique., "Development of GaInP/GaInAs/Ge Triple-Junction Solar Cells for CPV Applications," Doctoral Thesis, Universidad Politencia de Madrid, 2014, chapter 2, p. 43-68.
Barrutia, L. et al., "On the Use of Sb to Improve the Performance of GaInP Subcells of Multijunction Solar Cells," IEEE 42nd Photovoltaic Specialist Conference (PVSC), 2015, 4 pages.
Barrutia, L. et al., "Effect of Ge autodoping during III-V MOVPE growth on Ge substrates," Journal of Crystal Growth, 2017, 6 pages.
Brammertz, G. et al., "Selective epitaxial growth of GaAs in Ge by MOCVD," Journal of Crystal Growth, 2006, vol. 297, p. 204-210.
Briddon et al., "Ab Initio Calculations on the Passivation of Shallow Impurities in GaAs," Physical Review Letters, May 1990, vol. 64, No. 21, p. 2535-2538.
Bruckner, S. et al., "In Situ Control of Si(100) and Ge(100) Surface preparation for the Heteroepitaxy of III-V Solar Cell Architectures," 8th Internation Conference on Concentrating Photovoltaic Systems, AIP Conference Proceedings, 2012, vol. 1477, p. 32-35.
Dixit, V.K. et al., "Investigation of crystalline and electronic band alignment properties of GaP/Ge(111) heterostructure," Applied Physics Letters, 2014, vol. 104, p. 092101.
Dlubek et al., "Point Defects in GaAs Studied by Correlated Positron Lifetime, Optical, and Electrical Measurements," Phys. Stat. Sol., 1988, vol. 106, p. 419-432.
Garcia, I. et al., "Degradation of subcells and tunnel junctions during growth of GaInP/Ga(In)As/GaNAsSb/Ge 4-junction solar cells," Progress in Photovoltaics, 2017, p. 1-9.
Gong, X. et al., "Drive Current Performance of Inversion Mode Ge CMOS Transistors," International Conference of Solid State Devices and Materials, 2014, p. 860-861.
Goss, J.P., "First Principles Study of Defects in Semiconductors," Thesis for University of Exeter, Jan. 1997, 181 pages.
He, W. et al., "Structural and optical properties of GaInP grown on germanium by metal-organic chemical vapor deposition," Applied Physics Letters, 2010, vol. 97, p. 121909.
Hudait, M.K. et al., "Slef-annihilation of antiphase boundaries in GaAs epilayers on Ge substrates grown by metal-organic vapor-phase epitaxy," Journal of Applied Physics, Jun. 2001, vol. 89, No. 11, p. 5972.
Kesan et al., "P-Type Doping of Germanium Grown by Molecular Beam Epitaxy on Ge(100) Substrates," Applied Physics Letters, Aug. 1991, vol. 59, No. 7, p. 852-854.
Kim, Y. et al., "InGaAsNSb/Ge double-junction solar cells grown by metalorganic chemical vapor deposition," Solar Energy, 2014, vol. 102, p. 126-130.
Kohen, D. et al., "The role of AsH3 partial pressure on anti-phase boundary in GaAs-on-Ge grown by MOCVD—application to a 200 mm GaAs virtual substrate," Manuscript for Journal of Crystal Growth, Apr. 2015, 24 pages.
Lin, Che-Yu, "Investigation of GaAs-based material heteroepitaxial growth and device applications," (Abstract only) Institute of Nanotechnology and Microsystems Engineering, Taiwan Theses & Dissertation Service, 2017, English translation, 7 pages.
Liu, B. et al., "High Performance Ge CMOS with Novel InAlP-Passivation Channels for Future Sub-10 nm Technology Node Applications," IEEE International Electron Devices Meeting, Dec. 2013, 3 pages.
Montanes, Enrique Barrigon, "Development of GaInP/GaInAs/Ge Triple-Junction Solar Cells for CPV Applications," Doctoral Theses for Universidad Politencia de Madrid, 2014, 27 pages.
Mukherjee, K. et al., "Growth, microstructure, and luminescent properties of direct-bandgap InAlP on relaxed InGaAs on GaAs substrates," Journal of Applied Physics, 2013, vol. 113, p. 183518.

(56) References Cited

OTHER PUBLICATIONS

Nishikawa, Y. et al., "MOCVD Growth of InGaAlP Using Ethyldimethylindium as an In Source and Application to Visible-Region Lasers," Journal of Crystal Growth, 1990, vol. 104, p. 245-249.

Nishikawa, Y. et al., "Effects of V/III ratio on Zn electrical activity in Zn-doped InGaAlP grown by metalorganic chemical vapor deposition," Journal of Crystal Growth, 1991, vol. 108, p. 728-732.

Ohba, Y. et al., "Growth of high-quality InGaAlP epilayers by MOCVD using methyl metalorganics and their application to visible semiconductor lasers," Journal of Crystal Growth, 1986, vol. 77, p. 374-379.

Olson et al., "High-Efficiency III-V Multijunction Solar Cells," World Conference on Photovoltaic Energy Conversion, 2006, 53 pages.

Owen, M. et al., "Band alignment study of lattice-matched InAlP and Ge using x-ray photoelectron spectroscopy," Applied Physics Letters, 2013, vol. 103, 031604, 5 pages.

Sophia, P.J. et al., "Influence of Surface Roughness on Interdiffusion Processes in InGaP/Ge Heteroepitaxial Thin Films," ECS Journal of Solid State Science and Technology, 2015, vol. 4, No. 3, p. P1-P4.

Stockman et al., "Characterization of heavily carbon-doped GaAs grown by metalorganic chemical vapor deposition and metalorganic molecular beam epitaxy," American Institute of Physics, Aug. 1992, vol. 72, Issue 3, p. 981-987.

Sung, W.J. et al., "Phosphorus Vacancy as a Deep Level in AlInP Layers," Japanese Journal of Applied Physics, 2000, vol. 39, p. 567-568.

Tian, Y. et al., "Influence of PH3 flow distribution on the growth of AlInP/GaInP distributed Bragg-reflector," International Conference on Optoelectronics and Microelectronics, Aug. 2012, p. 41-44.

Wang, B., "Red InGaP light-emitting diodes epitaxially grown on engineered Ge-on-Si substrates," Proc of SPIE, Light-Emitting Diodes: Materials, Devices, and Applications for Solid State Lighting, Mar. 2016, vol. 9768, 8 pages.

Wang, C. et al., "Epitaxy and characterization of GaInP/AlInP light-emitting diodes on As-doped Ge/Si substrates," Optics Express, Oct. 2016, vol. 24, No. 20, p. 23129-23135.

Non-Final Office Action for U.S. Appl. No. 15/598,073, dated Sep. 13, 2017, 11 pages.

Non-Final Office Action for U.S. Appl. No. 15/660,471, dated Apr. 19, 2019, 8 pages.

International Search Report and Written Opinion for Application No. PCT/US2017/043965, dated Oct. 5, 2017, 14 pages.

International Search Report and Written Opinion for Application No. PCT/US2019/018106, dated May 13, 2019, 17 pages.

Search Report for Taiwan Application No. 106127801, dated Jul. 26, 2018, 1 page.

International Search Report and Written Opinion for Application No. PCT/US2019/045731, dated Sep. 30, 2019, 14 pages.

Final Office Action for U.S. Appl. No. 15/660,471, dated Oct. 21, 2019, 8 pages.

\* cited by examiner

| Layer Name | Layer Function | |
|---|---|---|
| InGaAs | InGaAs Contact | 536 |
| InAlP | FSF (Front Surface Field) | 534 |
| AlGaInP | Emitter | 532 |
| AlGaInP | Base | 530 |
| AlGaInP | BSF (Back Surface Field) | 528 |
| AlGaAs | Tunnel Junction | 526 |
| GaAs | Tunnel Junction | 526 |
| AlGaInP | FSF (Front Surface Field) | 524 |
| AlGaAs | Emitter | 522 |
| AlGaAs | Base | 520 |
| AlGaAs | BSF (Back Surface Field) | 518 |
| Hydrogen Barrier | Hydrogen Diffusion Barrier Region | 507A |
| InGaAs | Tunnel Junction | 516 |
| InGaAs | Tunnel Junction | 516 |
| InGaAs | Emitter | 514 |
| GaInNAsSb | Base | 512B |
| GaInNAsSb | Base | 512A |
| InGaAs | BSF (Back Surface Field) | 510 |
| InGaAs | Tunnel Junction 508B | 508 |
| InGaAs | Tunnel Junction 508A | 508 |
| InGaAs | Buffer Layer | 506 |
| InGaP, InGaPSb, InAlP or AlP/InAlP | Nucleation Layer | 504 |
| (Se,Sn) Ge | Substrate, Base | 502 |

505 brackets layers 528–534
503 brackets layers 518–524
501 brackets layers 510–516

FIG. 5A

| Layer Name | Layer Function | |
|---|---|---|
| InGaAs | InGaAs Contact | 536 |
| InAlP | FSF (Front Surface Field) | 534 |
| AlGaInP | Emitter | 532 |
| AlGaInP | Base | 530 |
| AlGaInP | BSF (Back Surface Field) | 528 |
| AlGaAs | Tunnel Junction | 526 |
| GaAs | Tunnel Junction | 526 |
| AlGaInP | FSF (Front Surface Field) | 524 |
| AlGaAs | Emitter | 522 |
| AlGaAs | Base | 520 |
| AlGaAs | BSF (Back Surface Field) | 518 |
| Hydrogen Barrier | Reflector/H-Diffusion Barrier Region | 507B |
| InGaAs | Tunnel Junction and Protective Cap Layer | 516 |
| InGaAs | Tunnel Junction | 516 |
| InGaAs | Emitter | 514 |
| GaInNAsSb | Base | 512B |
| GaInNAsSb | Base | 512A |
| InGaAs | BSF (Back Surface Field) | 510 |
| InGaAs | Tunnel Junction 508B | 508 |
| InGaAs | Tunnel Junction 508A | 508 |
| InGaAs | Buffer Layer | 506 |
| InGaP, InGaPSb, InAlP or AlP/InAlP | Nucleation Layer | 504 |
| (Se,Sn) Ge | Substrate, Base | 502 |

Groups: 505 = {534, 532, 530, 528}; 503 = {524, 522, 520, 518}; 501 = {514, 512B, 512A, 510}

FIG. 5B

| Layer Name | Layer Function | |
|---|---|---|
| InGaAs | InGaAs Contact | 536 |
| InAlP | FSF (Front Surface Field) | 534 |
| AlGaInP | Emitter | 532 |
| AlGaInP | Base | 530 |
| AlGaInP | BSF (Back Surface Field) | 528 |
| AlGaAs | Tunnel Junction | 526 |
| GaAs | Tunnel Junction | |
| AlGaInP | FSF (Front Surface Field) | 524 |
| AlGaAs | Emitter | 522 |
| AlGaAs | Base | 520 |
| AlGaAs | BSF (Back Surface Field) | 518 |
| InGaAs | Tunnel Junction | 516 |
| InGaAs | Tunnel Junction | |
| Hydrogen Barrier | Window/H-Diffusion Barrier Region | 509 |
| InGaAs | Emitter | 514 |
| GaInNAsSb | Base | 512B |
| GaInNAsSb | Base | 512A |
| InGaAs | BSF (Back Surface Field) | 510 |
| InGaAs | Tunnel Junction 508B | 508 |
| InGaAs | Tunnel Junction 508A | |
| InGaAs | Buffer Layer | 506 |
| InGaP, InGaPSb, InAlP or AlP/InAlP | Nucleation Layer | 504 |
| (Se,Sn) Ge | Substrate, Base | 502 |

505: layers 528–534
503: layers 518–524
501: layers 510–514

FIG. 5C

| Layer Name | Layer Function | |
|---|---|---|
| InGaAs | InGaAs Contact | 536 |
| InAlP | FSF (Front Surface Field) | 534 |
| AlGaInP | Emitter | 532 |
| AlGaInP | Base | 530 |
| AlGaInP | BSF (Back Surface Field) | 528 |
| AlGaAs | Tunnel Junction | 526 |
| GaAs | Tunnel Junction | 526 |
| AlGaInP | FSF (Front Surface Field) | 524 |
| AlGaAs | Emitter | 522 |
| AlGaAs | Base | 520 |
| AlGaAs | BSF (Back Surface Field) | 518 |
| InGaAs | Tunnel Junction and Protective Cap Layer | 516 |
| InGaAs | Tunnel Junction | 516 |
| Hydrogen Barrier | Emitter/H-Diffusion Barrier Region | 515 |
| GaInNAsSb | Base | 512B |
| GaInNAsSb | Base | 512A |
| InGaAs | BSF (Back Surface Field) | 510 |
| InGaAs | Tunnel Junction 508B | 508 |
| InGaAs | Tunnel Junction 508A | 508 |
| InGaAs | Buffer Layer | 506 |
| InGaP, InGaPSb, InAlP or AlP/InAlP | Nucleation Layer | 504 |
| (Se,Sn) Ge | Substrate, Base | 502 |

505 groups layers 528–534
503 groups layers 518–524
501 groups layers 510–515

FIG. 5D

HYDROGEN DIFFUSION BARRIER FOR HYBRID SEMICONDUCTOR GROWTH

This application claims the benefit under 35 U.S.C. § 119(e) of U.S. Provisional Application No. 62/716,814 filed on Aug. 9, 2018, which is incorporated by reference in its entirety.

FIELD

The present invention relates to semiconductor devices and to methods of fabricating semiconductor devices having a dilute nitride active layer and at least one semiconductor material overlying the dilute nitride active layer. Particularly, the present invention relates to hybrid epitaxial growth of high-efficiency multijunction solar cells and dilute nitride photonic devices.

BACKGROUND

Epitaxial growth of III-V materials is a cornerstone technology for the wireless, optical and photovoltaic industries. Structures such as pseudomorphic high electron mobility transistors (PHEMTs), heterojunction bipolar transistors (HBTs), vertical-cavity surface-emitting lasers (VCSELs) and multijunction solar cells require the purity and crystalline quality that only epitaxial growth can provide. Two technologies used to fabricate multijunction solar cells are molecular beam epitaxy (MBE) and metal-organic chemical vapor deposition (MOCVD, or metal-organic chemical vapor deposition, MOVPE, or organometallic vapor phase epitaxy, OMVPE).

Dilute nitrides are a class of III-V semiconductor alloy materials (alloys having one or more elements from Group III in the periodic table along with one or more elements from Group V in the periodic table) with small fractions (less than about 7 atomic percent or 5 atomic percent, for example) of nitrogen). Dilute nitrides are of interest since they have a lattice constant that can be varied to be substantially matched to a broad range of substrates, including GaAs and germanium, and/or other semiconductor layers such as subcells for photovoltaic cells formed from materials other than dilute nitrides. The lattice constant can be controlled by the relative fractions of the different group IIIA and group VA elements. Thus, by tailoring the compositions (i.e., the elements and quantities) of a dilute nitride material, a wide range of lattice constants and band gaps may be obtained. Further, high quality material may be obtained by optimizing the composition around a specific lattice constant and band gap, while limiting the total antimony content to no more than 20 percent of the Group V lattice sites, such as to no more than 3 percent of the Group V lattice sites, or to no more than 1 percent of the Group V lattice sites.

Although metamorphic structures for III-V multijunction photovoltaic cells can be used, lattice-matched dilute nitride structures are preferred due to band gap tunability and lattice constant matching, making dilute nitrides ideal for integration into multijunction photovoltaic cells with substantial efficiency improvements. Dilute nitrides have proven performance reliability and require less semiconductor material in manufacturing. The high efficiencies of dilute nitride photovoltaic cells make them attractive for terrestrial concentrating photovoltaic systems and for photovoltaic systems designed to operate in space. Dilute nitrides are also of interest for photonic devices such as photodetectors and semiconductor lasers such as VCSELs. Significantly, thermal treatment is an essential and unique step in the fabrication of dilute nitride devices, which is not required for conventional semiconductors. A thermal load is required to ameliorate structure defects within the dilute nitride material.

Although MOCVD is a preferred technology in solar cell commercial production, plasma-assisted MBE is used for growing dilute nitride materials having a band gap of about 1 eV. It is difficult to incorporate a sufficient mole fraction of nitrogen by MOCVD into the lattice of epilayers. Plasma-assisted MBE offers superior dilute nitride composition control and material quality, in part because the process is able to produce more nitrogen radicals, which increases nitrogen incorporation into the semiconductor layers to reduce the band gap within a range from about 0.7 eV to 1.2 eV. Other junctions in a multijunction solar cell (e.g., (Al)GaAs, (Al)(In)GaP)) can be grown by either MBE or MOCVD with comparable performance and quality.

MBE growth occurs on a heated substrate in an ultra-high vacuum (UHV) environment (with a base pressure ~1E-9 Torr) typically using elemental sources without a carrier gas. The UHV environment ensures material purity. Layered structures are achieved by shuttering. It can be challenging to adapt MBE to commercial production.

MOCVD growth occurs on a heated substrate in a totally different pressure regime than MBE (typically 15 Torr to 750 Torr). Unlike MBE, MOCVD uses complex compound sources, namely metal-organic sources (e.g., tri-methyl Ga, In, Al, etc.), hydrides (e.g., $AsH_3$, etc.), and other gas sources (e.g., disilane). In MOCVD, the reactants flow across the substrate where they react with the surface resulting in epitaxial growth. In contrast to MBE, MOCVD requires the use of a carrier gas (typically hydrogen) to transport reactants across the substrate surface. Layered structures are achieved by valve actuation for differing injection ports of a gas manifold. Maintenance of the MOCVD apparatus is much more frequent than for an MBE apparatus but less time consuming. Therefore, MOCVD is able to recover more quickly from equipment failures or reconfiguration. MBE, on the other hand, involves longer maintenance periods and has setup variability limitations. MOCVD is the preferred technology in commercial production due to lower operational costs.

Hydrogen gas is often used as a carrier for arsenide and phosphide growth, and therefore semiconductor materials grown by MOCVD can be unintentionally doped with hydrogen. During epitaxy, hydrogen gas can arise from (1) the hydrogen gas carrier itself, and (2) through cracking of arsine or phosphine at the semiconductor surface, during which covalent bonds are broken and hydrogen is released. In contrast, MBE epitaxy uses solid or plasma sources without carrier gases, which eliminates complications resulting from the presence of hydrogen in the reactor. Once epiwafers are transferred from a low-hydrogen (MBE) environment to a hydrogen-rich (MOCVD) environment, hydrogen gas can diffuse into MBE-grown semiconductor layers and cause passivation-compensation and/or introduce isolated donor or defects in these layers, for example, complex defects of nitrogen and hydrogen, such as N—H and N—H—$V_{Ga}$ (where $V_{Ga}$ is associated with gallium vacancies). Additionally, MBE growth of semiconductor materials on an underlying MOCVD-grown semiconductor structure may cause hydrogen within the underlying MOCVD layer to diffuse into the MBE-grown materials. Unintentional hydrogen doping will contaminate and degrade a dilute nitride active layer purposely grown at slow rates in the ultra-high vacuum MBE. Each epitaxial growth technique has its specific merits in specific device applications. For this reason, new and improved MOCVD/MBE hybrid epitaxial growth techniques and structures are required to harness the benefits and mitigate the down-sides of both techniques.

Successful implementation of MOCVD/MBE hybrid epitaxy requires proper protection of grown intermediate epitaxial layers so that the top surfaces of such layers remain pristine and "epi-ready" for overgrowth. Oxidation or contamination of the interface layers must be prevented to make hybrid growth viable. The layers should also reduce or prevent diffusion of hydrogen from MOCVD growth into underlying and/or or overlying dilute nitride active layers and should also be able to withstand thermal treatments used in dilute nitride epitaxial processing. Use of sacrificial layers as protective or cap layers to be etched away prior to subsequent growth steps is inefficient, especially in high-volume production.

SUMMARY

This disclosure describes the design of an epitaxial structure and growth schedule that minimizes surface contamination and defects as epitaxial growth is interrupted in one reactor (MBE or MOCVD) and then resumed in a different reactor. The structures and processes also mitigate the effects of diffusion of hydrogen from MOCVD growth into underlying and/or or overlying MBE-grown dilute nitride active layers.

Dilute nitride electronic devices described in this disclosure result from the successful implementation of the MOCVD/MBE hybrid growth method. High efficiency devices result from specific epitaxial structure design (e.g., layer thicknesses and doping profiles), growth conditions (e.g., temperatures during growth and idle times, as well as growth rates), and deliberate partial or full annealing of dilute nitride active layers during the hybrid fabrication process with minimized degradation to other junctions. The MOCVD/MBE hybrid method can also be applied to non-solar opto-electronic/photonic devices that incorporate at least one dilute nitride active layer, such as lasers, vertical-cavity surface-emitting lasers (VCSELs), detectors, and power converters.

According to embodiments of the present invention, semiconductor devices comprise a hydrogen diffusion barrier region overlying and/or a dilute nitride active layer, wherein the hydrogen diffusion barrier comprises a doped layer.

According to some embodiments of the present invention, semiconductor devices comprise a hydrogen diffusion barrier region overlying a dilute nitride active layer, wherein the hydrogen diffusion barrier comprises a strained layer.

According to the present invention, methods of fabricating a semiconductor device comprise a dilute nitride active layer, comprising providing a substrate; growing a dilute nitride active layer overlying the substrate using molecular beam epitaxy; growing a hydrogen diffusion barrier region overlying the dilute nitride active layer using molecular beam epitaxy; applying a first thermal treatment to the substrate, the dilute nitride active layer, and the hydrogen diffusion barrier region; growing one or more semiconductor layers overlying the annealed hydrogen diffusion barrier region using metal-organic chemical vapor deposition; and applying a second thermal treatment to the substrate, the dilute nitride active layer, the hydrogen diffusion barrier region, and the one or more semiconductor layers.

BRIEF DESCRIPTION OF THE DRAWINGS

Those skilled in the art will understand that the drawings described herein are for illustration purposes only. The drawings are not intended to limit the scope of the present disclosure.

FIG. 5A-5D show summaries of the composition and function of certain layers/regions that may be present in embodiments of 4J multijunction solar cells comprising AlInGaP/(Al)(In)GaAs/GaInNAsSb/Ge, according to the present disclosure.

DETAILED DESCRIPTION

Figure 1A:
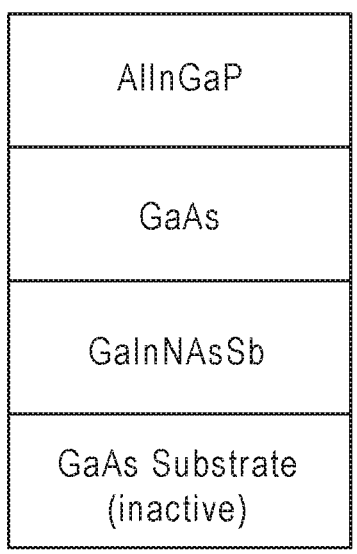
FIGS. 1A-1C show examples of junction compositions for 3J (3-junction), 4J (4-junction) and 5J (5-junction) multijunction photovoltaic cells.

The devices and methods of the present disclosure facilitate the manufacturing of high quality electronic and opto-electronic devices that result from successful implementation of MBE/MOCVD hybrid epitaxy. The devices and methods disclosed include details that pertain to dilute nitride multijunction solar cells, and photonic devices including photodetectors and lasers.

The composition of a dilute nitride can be modified to achieve a wide range of lattice constants and band gaps. Examples of suitable dilute nitrides include GaNAs, GaInNAs, GaInNAsSb, GaInNAsBi, GaInNAsSbBi, GaNAsSb, GaNAsBi and GaNAsSbBi. High quality dilute nitrides can be obtained by tailoring the quantities of each element around a specific lattice constant and band gap, while limiting the total Sb content to no more than 20 percent of the Group V lattice sites, such as to no more than 3 percent of the Group V lattice sites, or to no more than 1 percent of the Group V lattice sites. Antimony, Sb, is believed to act as a surfactant that promotes smooth growth morphology of the III-AsNV alloys. In addition, Sb can facilitate uniform incorporation of nitrogen and minimize the formation of nitrogen-related defects. The incorporation of Sb into a III-AsNV alloy can enhance the overall nitrogen incorporation and reduce the alloy band gap, aiding the realization of lower band gap alloys. However, there are additional defects created by Sb and therefore it is desirable that the total concentration of Sb be limited to no more than 20 percent of the Group V lattice sites. Furthermore, the limit to the Sb content decreases with decreasing nitrogen content. Alloys that include In can have even lower limits to the total content because In can reduce the amount of Sb needed to tailor the lattice constant. For alloys that include In, the total Sb content may be limited to no more than 3 percent of the Group V lattice sites such as to no more than 1 percent of the Group V lattice sites. For example, $Ga_{1-x}In_xN_yAs_{1-y-z}Sb_z$, disclosed in U.S. Application Publication No. 2010/0319764, incorporated herein by reference, can produce a high-quality material for a dilute nitride active layer when substantially lattice-matched to a GaAs or Ge substrate in the composition range of $0.08 \leq x \leq 0.18$, $0.025 \leq y \leq 0.04$ and $0.001 \leq z \leq 0.03$, with a band gap of at least 0.9 eV. Further examples of multijunction photovoltaic cells that have dilute nitride subcells are disclosed, for example, in U.S. Pat. No. 8,912,433, in U.S. Pat. No. 8,962,993, in U.S. Pat. No. 9,214,580, in U.S. Application Publication No. 2017/0110613, and in U.S. Application Publication No. 2017/0213922, each of which is incorporated by reference in its entirety, which disclose compositional ranges between $0 \leq x \leq 0.24$, $0.001 \leq y \leq 0.07$ and $0.001 \leq z \leq 0.2$, and with thicknesses between about 1 micron and 4 microns. In some examples, multijunction photovoltaic cells can comprise more than one dilute nitride subcell, with each subcell having a different elemental composition and bandgap.

In some examples, a multijunction photovoltaic cell can include a dilute nitride subcell where the dilute nitride active layer comprises more than one sub-layer, where the doping and/or composition of the sub-layers may differ. Dilute nitride sub-cells having graded doping profiles are disclosed, for example, in U.S. Pat. No. 9,214,580, U.S. Application Publication No. 2016/0118526, and U.S. Patent Application No, 2017/0338357, each of which is incorporated by reference in its entirety. These publications describe dilute nitride base layers comprising an intentionally doped region with thicknesses between 0.4 microns and 3.5 microns, and with p-type doping levels between $1 \times 10^{15}$ cm$^{-3}$ and $1 \times 10^{19}$ cm$^{-3}$, and further comprising an intrinsic (or unintentionally doped) diluted nitride layer or an intentionally doped dilute nitride active layer with a constant dopant concentration, having a thickness from 0.1 microns and about 1 micron.

The terms "layer" and "region" are used throughout the specification. A "layer" refers to a semiconductor material having a substantially single elemental composition. A layer can be doped, and different portions of a layer can comprise different dopants and/or different dopant concentrations. A "region" refers to a semiconductor material that can comprise a single layer having substantially the same elemental composition, or a graded elemental composition, or can comprise more than one semiconductor layer, wherein at least some of the semiconductor layers have a different elemental composition. Each of the semiconductor layers forming a region can be undoped or doped and the doping can vary within a layer. For example, a "hydrogen diffusion barrier region" can comprise one or more semiconductor layers. A "dilute nitride active layer" refers to a single layer of semiconductor material. When referred to in the context of a photovoltaic cell, the "dilute nitride active layer" refers to the base layer of the photovoltaic cell. A photovoltaic cell can comprise other layers such as back surface field, emitter, front surface field and window layers, which may or may not comprise a dilute nitride material. A multiple quantum well structure such as a vertical cavity surface emitting laser can comprise multiple dilute nitride active layers separated by semiconductor layers comprising a different material, and each of the layers can be grown by the same technique such as using MBE.

A doped region or doped layer refers to a region or doped layer that is intentionally doped. For example, a p-doped Ge layer refers to a Ge layer that has been intentionally doped with a p-type dopant. An intentionally doped layer has a concentration of the intentional dopant that is greater than the concentration of the dopant in the intrinsic material. An undoped material can have a concentration of dopants that are intrinsic to the deposition process and can result, for example, from impurities in the materials being deposited, background contaminants in the system, or dopants that are undesired artifacts of the deposition process. A material can have a concentration of an intrinsic dopant, for example, less than $10^{16}$ atoms/cm$^{-3}$ or less than $10^{15}$ atoms/cm$^{-3}$. A material can have a concentration of an intentional dopant, for example, greater than $10^{16}$ atoms/cm$^{-3}$, greater than $10^{17}$ atoms/cm$^{-3}$ or greater than $10^{18}$ atoms/cm$^{-3}$.

Dilute nitride active layers having a bandgap that is non-uniform in the growth direction, orthogonal to the substrate surface are described in U.S. Provisional Application No. 62/816,718 filed on Mar. 11, 2019, which is incorporated by reference in its entirety.

Compositions and structures for dilute nitride materials for photonic devices such as power converters and photodetectors are disclosed in U.S. Application Publication No. 2015/0221803, and in U.S. Provisional Application No. 62/564,124, filed on Sep. 27, 2017, each of which is incorporated by reference in its entirety.

Dilute nitride active regions having multiple layers of dilute nitride materials for semiconductor lasers, and in particular, vertical cavity surface emitting lasers (VCSELs) are known, allowing emission wavelengths between about 1.3 µm and 1.6 µm. Dilute nitride lasers and their compositions are described, for example, in U.S. Pat. Nos. 6,798,809 and 7,645,626, and by Wistey et al., in "GaInNAsSb/GaAs vertical cavity surface emitting lasers at 1534 nm", Electron. Lett., 42(5), 2006. Generally, quantum well materials with an In composition between about 29% and 44%, N composition up to about 4% and Sb composition up to about 7% have been reported.

Aluminum-containing layers that can mitigate the effects of hydrogen diffusion into dilute nitride active layers are described in U.S. Application Publication No. 2019/0013429 A1, which is incorporated by reference in its entirety.

All semiconductor layers in the structures disclosed can be lattice-matched or pseudomorphically strained to each of the other layers. "Lattice matched" refers to semiconductor layers for which the in-plane lattice constants of adjoining materials in their fully relaxed states differ by less than 0.6% when the materials are present in thicknesses greater than 100 nm. Further, subcells that are substantially lattice matched to each other means that all materials in the subcells that are present in thicknesses greater than 100 nm have in-plane lattice constants in their fully relaxed states that differ by less than 0.6%. In an alternative meaning, substantially lattice matched refers to the strain. Pseudomorphically strained layers can have an in-plane lattice constant that matches the lattice constant of the substrate, the lattice mismatch accommodated by strain within the pseudomorphic layer. As such, base layers can have a strain from 0.1% to 6%, from 0.1% to 5%, from 0.1% to 4%, from 0.1 to 3%, from 0.1% to 2%, or from 0.1% to 1%; or can have strain less than 6%, less than 5%, less than 4%, less than 3%, less than 2%, or less than 1%. Strain refers to compressive strain and/or to tensile strain. The thickness of a pseudomorphically strained layer is less than the critical thickness for the layer, the thickness beyond which, the strain energy can no longer be accommodated by the layer and strain-related defects such as stacking faults are introduced into the material. Lattice-matched and pseudomorphically strained layer are free of strain-related defects.

In certain embodiments of $Ga_{1-x}In_xN_yAs_{1-y-z}Sb_z$ provided by the present disclosure, the N content is not more than 7 percent of the Group V lattice sites. In certain embodiments, the N content is not more than 4 percent, and in certain embodiments, not more than 3 percent.

The present invention includes multijunction solar cells with three or more subcells such as three-, four- and five-junction subcells incorporating at least one $Ga_{1-x}In_xN_yAs_{1-y-z}Sb_z$ subcell. The band gaps of the $Ga_{1-x}In_xN_yAs_{1-y-z}Sb_z$ materials can be tailored by varying the content of Ga, In, N and/or As while controlling the overall content of Sb. Thus, a $Ga_{1-x}In_xN_yAs_{1-y-z}Sb_z$ subcell with a band gap suitable for integrating with the other subcells of a multijunction solar cell may be fabricated while maintaining substantial lattice-matching to the other subcells. The band gaps and compositions of the $Ga_{1-x}In_xN_yAs_{1-y-z}Sb_z$ subcells can be tailored so that the short-circuit current produced by the $Ga_{1-x}In_xN_yAs_{1-y-z}Sb_z$ subcells will be the same as or slightly greater than the short-circuit current of the other subcells in the solar cell. Because $Ga_{1-x}In_xN_yAs_{1-y-z}Sb_z$ materials provide high quality, lattice-matched and band gap tunable subcells, the disclosed solar cells comprising $Ga_{1-x}In_xN_yAs_{1-y-z}Sb_z$ subcells can achieve high conversion efficiencies. The increase in efficiency is largely due to less light energy being lost as heat, as the additional subcells allow more of the incident photons to be absorbed by semiconductor materials with band gaps closer to the energy level of the incident photons. In addition, there will be lower series resistance losses in these multijunction solar cells compared with other solar cells due to the lower operating currents. At higher concentrations of sunlight, the reduced series resistance losses become more pronounced. Depending on the band gap of the bottom subcell, the collection of a wider range of photons in the solar spectrum may also contribute to the increased efficiency.

Designs of multijunction solar cells with more than three subcells in the prior art predominantly rely on metamorphic growth structures, new materials, or dramatic improvements in the quality of existing subcell materials in order to provide structures that can achieve high efficiencies. Solar cells containing metamorphic buffer layers may have reliability concerns due to the potential for dislocations originating in the buffer layers to propagate over time into the subcells, causing degradation in performance. In contrast, $Ga_{1-x}In_xN_yAs_{1-y-z}Sb_z$ materials can be used in solar cells with more than three subcells to attain high efficiencies while maintaining substantial lattice-matching between subcells, which is advantageous for reliability. For example, reliability testing on $Ga_{1-x}In_xN_yAs_{1-y-z}Sb_z$ subcells provided by the present disclosure has shown that multijunction solar cells comprise a $Ga_{1-x}In_xN_yAs_{1-y-z}Sb_z$ subcell, such devices can survive the equivalent of 390 years of on-sun operation at 100° C. with no failures. The maximum degradation observed in these subcells was a decrease in open-circuit voltage of about 1.2%.

For applications in space, radiation hardness, which refers to minimal degradation in device performance when exposed to ionizing radiation, including electrons and protons, is of great importance. Multijunction solar cells incorporating $Ga_{1-x}In_xN_yAs_{1-y-z}Sb_z$ subcells provided by the present disclosure have been subjected to proton radiation testing to examine the effects of degradation in space environments. Compared to Ge-based triple junction solar cells, the results demonstrate that these $Ga_{1-x}In_xN_yAs_{1-y-z}Sb_z$ containing devices have similar power degradation rates and superior voltage retention rates. Compared to non-lattice matched (metamorphic) triple junction solar cells, all metrics are superior for $Ga_{1-x}In_xN_yAs_{1-y-z}Sb_z$ containing devices. In certain embodiments, the solar cells include (Al)InGaP subcells to improve radiation hardness compared to (Al)(In)GaAs subcells.

Due to interactions between the different elements, as well as factors such as the strain in the dilute nitride layer, the relationship between composition and band gap for $Ga_{1-x}In_xN_yAs_{1-y-z}Sb_z$ is not a simple function of composition. The composition that yields a desired band gap with a specific lattice constant can be found by empirically varying the composition.

The thermal dose applied to the $Ga_{1-x}In_xN_yAs_{1-y-z}Sb_z$ material, which is controlled by the intensity of heat applied for a given duration of time (e.g., application of a temperature of 600° C. to 900° C. for a duration of between 10 seconds to 10 hours), that a $Ga_{1-x}In_xN_yAs_{1-y-z}Sb_z$ material receives during growth and after growth, also affects the relationship between band gap and composition. In general, the band gap increases as thermal dose increases.

As development continues on $Ga_{1-x}In_xN_yAs_{1-y-z}Sb_z$ materials, solar cells comprising $Ga_{1-x}In_xN_yAs_{1-y-z}Sb_z$ subcells, and photodetectors comprising $Ga_{1-x}In_xN_yAs_{1-y-z}Sb_z$ materials, it is expected that material quality will continue to improve, enabling higher efficiencies from the same or similar compositions as those described in the present disclosure. It should be appreciated, however, that because of the complex interdependence of the GaInNAsSb material composition and the processing parameters it cannot necessarily be determined which combination of materials and processing conditions will produce suitable high efficiency subcells having a particular band gap.

As the composition is varied within the $Ga_{1-x}In_xN_yAs_{1-y-z}Sb_z$ material system, the growth conditions need to be modified. For example, for (Al)(In)GaAs, the growth temperature will increase as the fraction of Al increases and decrease as the fraction of In increases, in order to maintain the same material quality. Thus, as a composition of either the $Ga_{1-x}In_xN_yAs_{1-y-z}Sb_z$ material or the other subcells of the multijunction solar cell is changed, the growth temperature as well as other growth conditions can be adjusted accordingly.

Figure 1B:
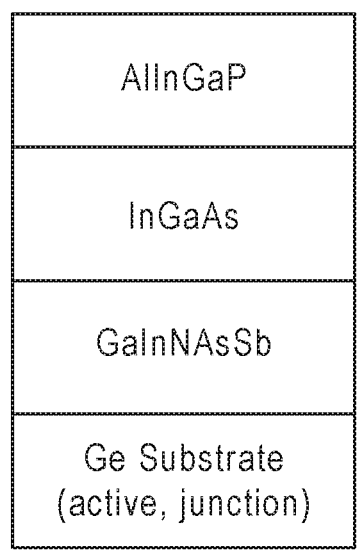
Figure 1C:
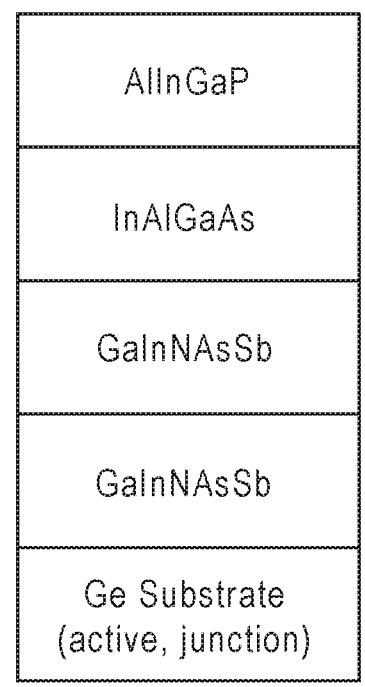

Schematic diagrams of three junction (3J), four junction (4J), and five junction (5J) solar cells are shown in FIGS. 1A-1C. In some examples as shown, the solar cells may be formed on a gallium arsenide (GaAs) substrate, or on a germanium substrate. In certain embodiments, the substrate can comprise GaAs, InP, GaSb, (Sn,Si)Ge, or silicon. Except for the experimental examples, as used herein, a germanium substrate refers to a (Sn,Si)Ge substrate, and includes, Ge, SnGe, SiGe, and SnSiGe. It can also include other substrates where the lattice constant is engineered to approximately match that of Ge, such as a buffered silicon substrate. Examples of buffers that can be grown on silicon to allow growth of Ge include SiGeSn, and rare-earth oxides (REOs).

In operation, a multijunction solar cell is configured such that the subcell having the highest band gap faces the incident solar radiation, with subcells characterized by increasingly lower band gap situated underlying or beneath the uppermost subcell. The $Ga_{1-x}In_xN_yAs_{1-y-z}Sb_z$ subcell at the bottom of a 3J solar cell (FIG. 1A) has a band gap within a range from 0.7 eV to 1.2 eV. The upper subcells can comprise (Al)(In)GaAs and (Al)(In)GaP, which have progressively higher band gaps to absorb high energy wavelengths of light. In a 4J or higher-junction solar cell, an active germanium subcell lies underneath the GaInNAsSb subcell to absorb lower energy of light. In some embodiments, such as a 5J or higher junction solar cell, two GaInNAsSb subcells with different band gaps may be used.

The specific band gaps of the subcells, are dictated, at least in part, by the band gap of the bottom subcell, the thicknesses of the subcell layers, and the spectrum of the incident light. Although there are numerous structures in the present disclosure that will produce efficiencies exceeding those of three junction solar cells, it is not the case that any set of subcell band gaps that falls within the disclosed ranges will produce an increased photovoltaic conversion efficiency. For a certain choice of bottom subcell band gap, or alternately the band gap of another subcell, the incident spectrum of light, the subcell materials, and the subcell layer thicknesses, there is a narrower range of band gaps for the remaining subcells that will produce efficiencies exceeding those of other three junction solar cells.

To create a complete multijunction solar cell, other layers that may be present include an anti-reflection coating, contact layers, tunnel junctions, electrical contacts and a substrate or wafer handle.

Although the various layers of a multijunction solar cell can be fabricated using semiconductor growth methods such as MOCVD and MBE, for certain materials higher quality layers are preferentially grown using a particular deposition method, such as by MOCVD or MBE. Thus, some layers of a multijunction solar cell are preferentially grown by MOVCD and other layers are preferentially grown by MBE. This can also apply to photonic devices, including lasers such as edge-emitting lasers, vertical-cavity-surface emitting lasers (VCSELs), and photodetectors including resonant-cavity photodetectors and avalanche photodetectors. MOCVD and MBE are characterized by different growth environments.

Hybrid growth of devices formed using a combination of MOCVD and MBE to fabricate individual layers or groups of layers typically requires transfer of the semiconductor wafer and epitaxial layers from one growth environment to another. Consequently, a protective layer is often used to protect the first set of epitaxial layers during transfer from one growth environment to another growth environment. This is done to ensure that after the transfer the top surface of the first set of epitaxial layers is ready for epitaxial growth. Oxidation or contamination of the growth layer must be prevented to make hybrid growth viable. In addition to preventing oxidation or contamination of the underlying growth layer, it is also desirable that the protective layer reduce or prevent diffusion of hydrogen during MOCVD growth into underlying dilute nitride active layers. It is also desirable that the protective layer withstand thermal treatments used in dilute nitride epitaxial processing. In embodiments of the present invention, a layer comprising a doped material and/or comprising a strained layer is used as a protective layer overlying the at least one dilute nitride active layer (or subcell).

FIGS. 2A-2B and FIGS. 3A-3B show simplified cross-sections of a multijunction solar cell according to embodiments of the present disclosure.

Figure 2A:
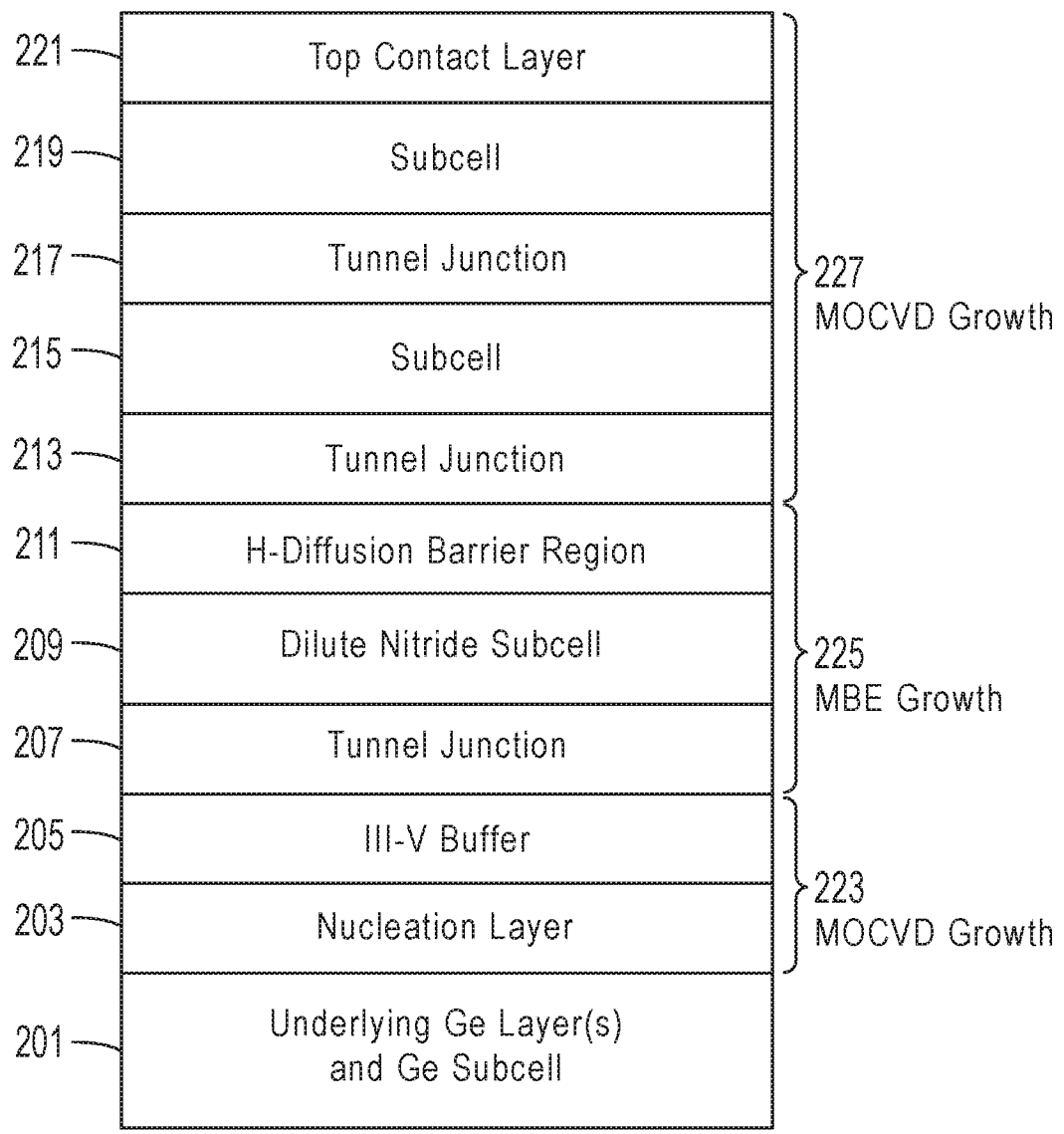
FIGS. 2A-2B show cross-sections of embodiments of a multijunction solar cell comprising a dilute nitride active layer and a hydrogen diffusion barrier region overlying the dilute nitride active layer.

FIG. 2A shows an example of a four-junction cell formed on a Ge substrate 201, which also serves as an active subcell. The Ge sub-cell 201, nucleation layer 203 and a portion of the buffer layer 205 can be formed using an MOCVD process (223). The tunnel junction 207, coupling the Ge subcell 201 to dilute nitride subcell 209, the dilute nitride subcell 209, and at least a portion of the overlying hydrogen diffusion barrier region 211 can be grown using an MBE process (225). The remaining overlying layers (tunnel junction 213, subcell 215, tunnel junction 217, subcell 219 and top contact layer 221) and a portion of the hydrogen diffusion barrier region 211 (as required) can be grown using an MOCVD process (227), allowing the MBE/MOCVD growth interface to be buried in the hydrogen diffusion barrier region 227. In this example, the hydrogen diffusion barrier region 211 underlies the tunnel junction 213 that couples the dilute nitride subcell 209 to the overlying subcell 215. Hydrogen diffusion barrier region 211 is shown as a single layer for simplicity. However, it will be understood that hydrogen diffusion barrier region 211 may comprise more than one layer, with differing layer compositions, thicknesses, doping levels and strain as described herein.

Figure 2B:
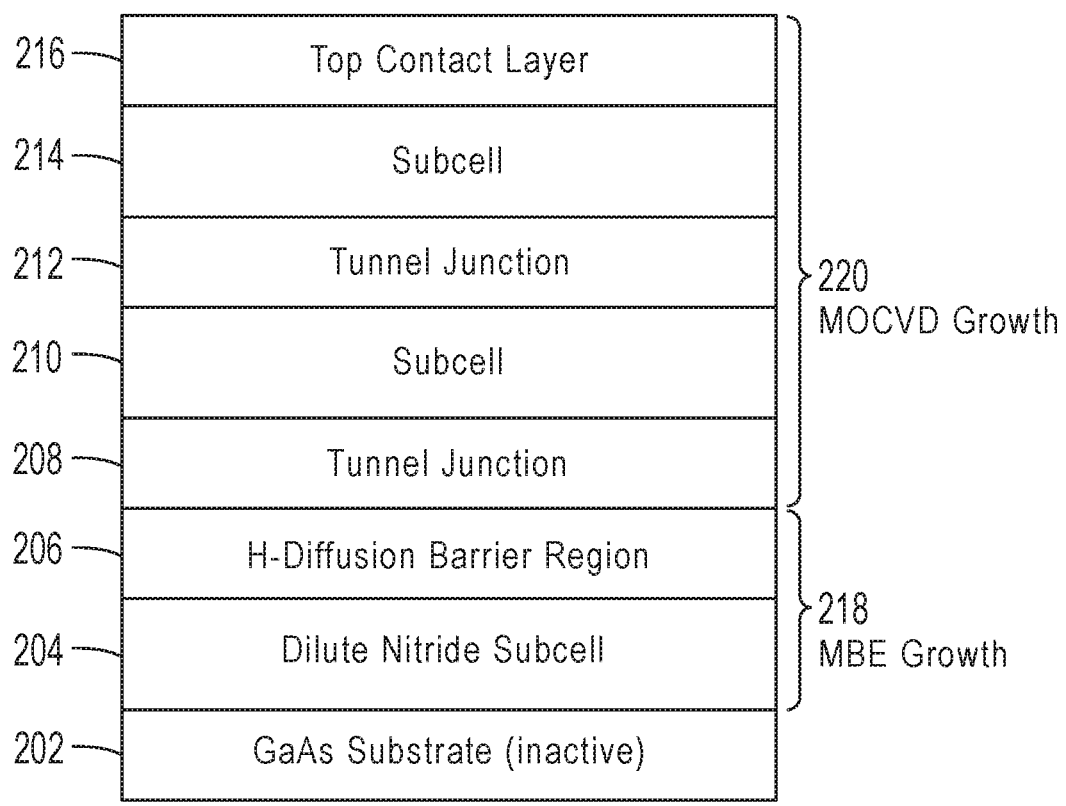

FIG. 2B shows an example of a three-junction cell designed for concentrated photovoltaic systems, formed on a GaAs substrate 202. The dilute nitride subcell 204 and at least a portion of the overlying hydrogen diffusion barrier region 206 can be grown using an MBE process (218). The remaining overlying layers (tunnel junction 208, subcell 210, tunnel junction 212, subcell 214 and top contact layer 216) and a portion of the H-diffusion barrier region 206 (as required) can be grown using an MOCVD process (220), allowing the MBE/MOCVD growth interface to be buried in the hydrogen diffusion barrier region 206. In this example, the hydrogen diffusion barrier region 206 underlies the tunnel junction 208 that couples the dilute nitride subcell 204 to the overlying subcell 210. The hydrogen diffusion barrier region 206 is shown as a single layer for simplicity. However, it will be understood that hydrogen diffusion barrier region 206 may comprise more than one layer, with differing layer compositions, thicknesses, doping levels and strain, as described herein.

Figure 3A:
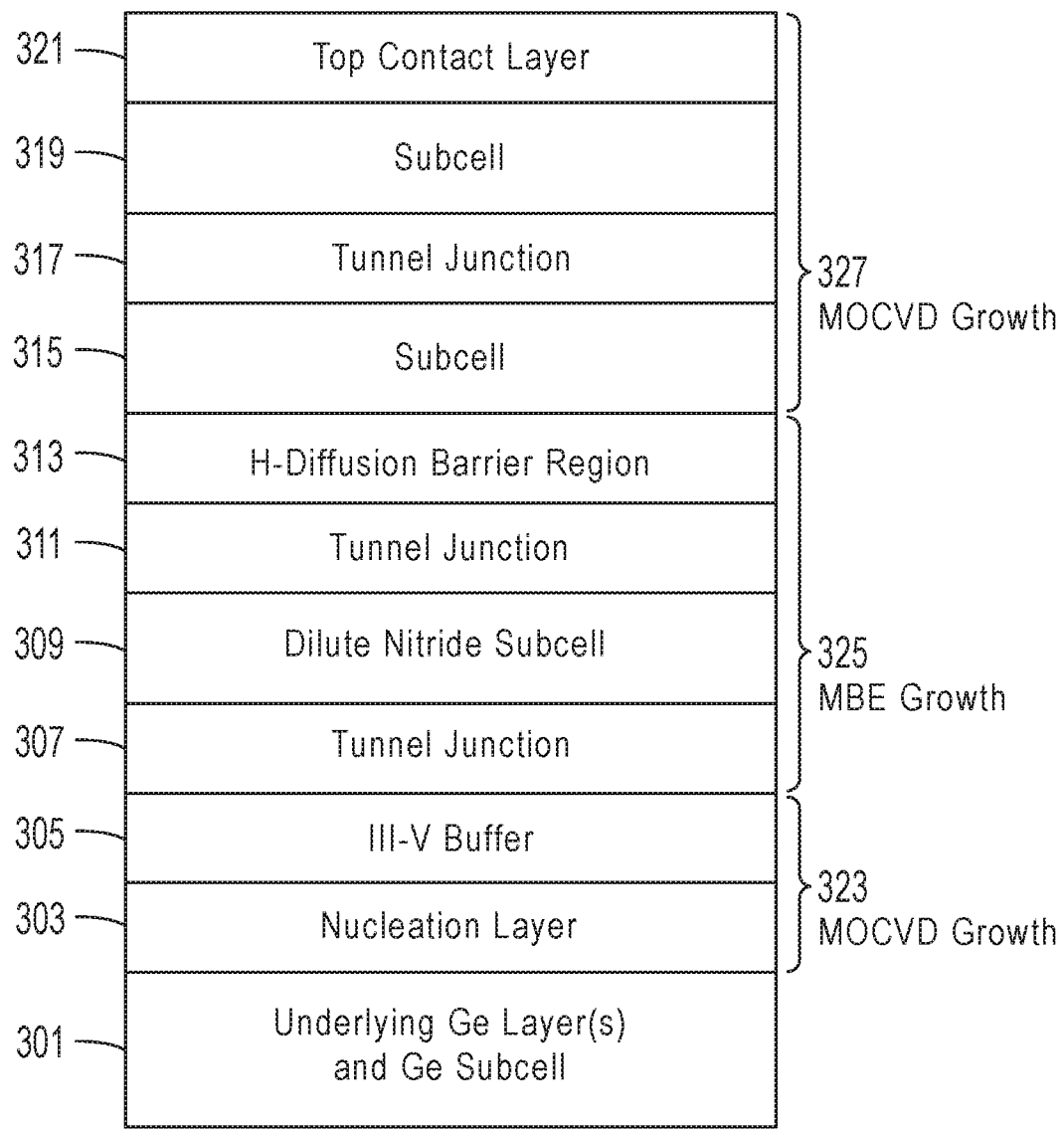
FIGS. 3A-3B show cross-sections of other embodiments of a multijunction solar cell comprising a dilute nitride active layer and a hydrogen diffusion barrier region overlying the dilute nitride active layer.

FIG. 3A shows an example of a four-junction cell formed on a Ge substrate 301, which also serves as an active subcell. The Ge sub-cell 301, nucleation layer 303 and a portion of the buffer layer 305 can be formed using an MOCVD process (323). The tunnel junction 307, coupling the Ge subcell 301 to dilute nitride subcell 309, the tunnel junction 311 coupling the dilute nitride subcell 309 to an overlying subcell 315 and at least a portion of the overlying hydrogen diffusion barrier region 313 can be grown using an MBE process (325). The remaining overlying layers (subcell 315, tunnel junction 317, subcell 319 and top contact layer 321) and a portion of the hydrogen diffusion barrier region 313 (as required) can be grown using an MOCVD process (327), allowing the MBE/MOCVD growth interface to be buried in the hydrogen diffusion barrier region 327. In this example, the hydrogen diffusion barrier region 313 overlies the tunnel junction 311 that couples the dilute nitride subcell 309 to the overlying subcell 315. Hydrogen diffusion barrier region 313 is shown as a single layer for simplicity. However, it will be understood that hydrogen diffusion barrier region 313 may comprise more than one layer, with differing layer compositions, thicknesses, doping levels and strain as described herein.

Figure 3B:
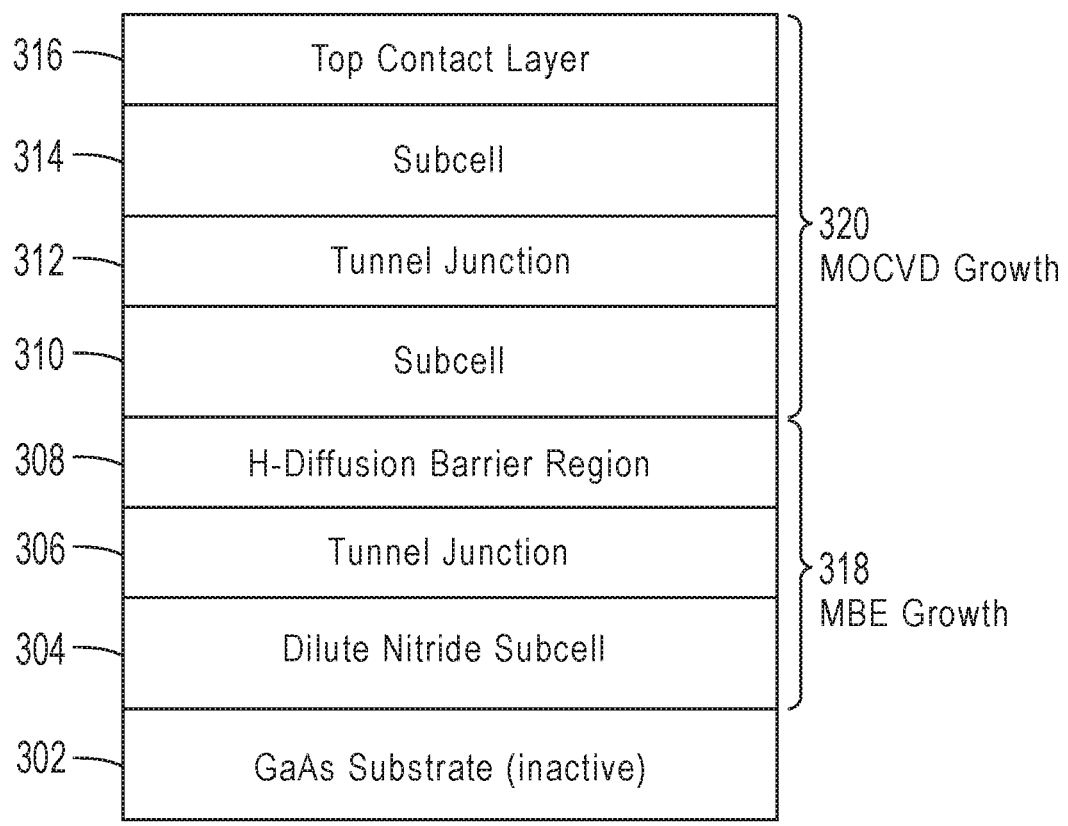

FIG. 3B shows an example of a three-junction cell designed for concentrated photovoltaic systems, formed on a GaAs substrate 302. The dilute nitride subcell 304, tunnel junction 306 coupling dilute nitride subcell 304 to overlying subcell 310, and at least a portion of the overlying hydrogen diffusion barrier region 308 can be grown using an MBE process (318). The remaining overlying layers (subcell 310, tunnel junction 312, subcell 314 and top contact layer 316) and a portion of the H-diffusion barrier region 308 (as required) can be grown using an MOCVD process (320), allowing the MBE/MOCVD growth interface to be buried in the hydrogen diffusion barrier region 308. In this example, the hydrogen diffusion barrier region 308 overlies the tunnel junction 306 that couples the dilute nitride subcell 304 to the overlying subcell 310. The hydrogen diffusion barrier region 308 is shown as a single layer for simplicity. However, it will be understood that hydrogen diffusion barrier region 308 may comprise more than one layer, with differing layer compositions, thicknesses, doping levels and strain, as described herein.

Figure 4:
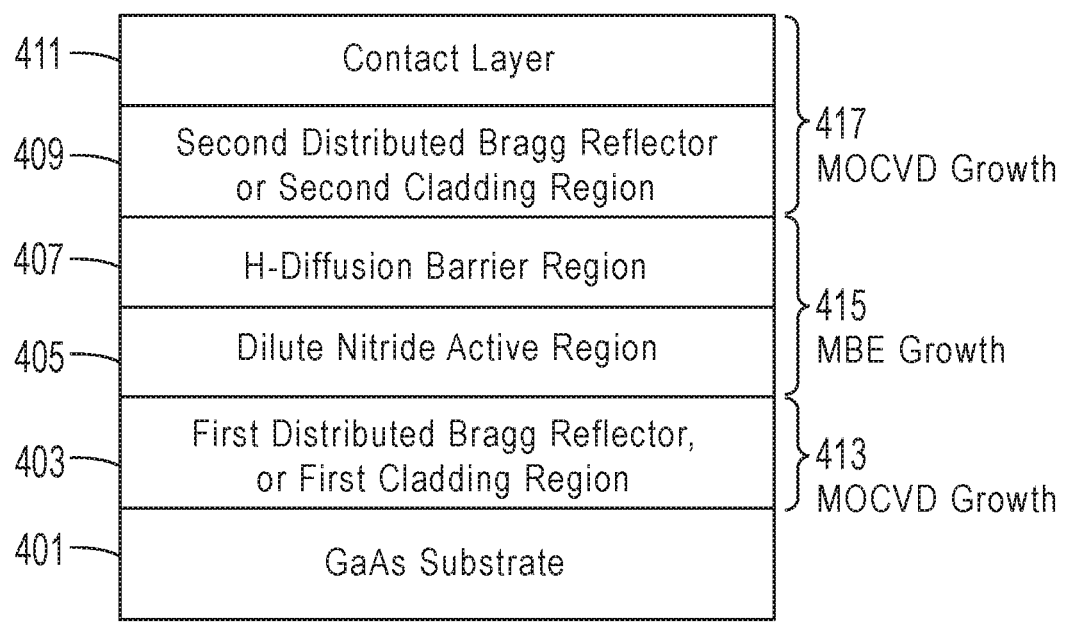
FIG. 4 shows a cross-section of an embodiment of a photonic device comprising a dilute nitride active layer and a hydrogen diffusion barrier region overlying the dilute nitride active layer.

FIG. 4 shows a simplified cross-section of a photonic device according to an embodiment of the invention. The photonic device comprises a substrate 401 such as GaAs, or a buffered substrate having a lattice constant approximately equal to the lattice constant for GaAs. A first cladding region or a first reflector such as a distributed Bragg reflector (DBR) 403 can be grown using an MOCVD process. A portion of layer 403 may also be grown using an MBE process 415. MBE process 415 is also used to grow a dilute nitride active layer 403 and at least a portion of the overlying hydrogen diffusion barrier region 407. The remaining overlying layers (second cladding region 409, top contact layer 411) and a portion of the hydrogen diffusion barrier region 407 (as required) can be grown using an MOCVD process (417), allowing the MBE/MOCVD growth interface to be buried in the hydrogen diffusion barrier region 407. The overlying layer 409 can also be a second reflector, such as a DBR. The dilute nitride active layer 405 is shown as a single layer for simplicity. However, it will be understood that dilute nitride active layer 405 may comprise more than one layer, with differing layer compositions, thicknesses, doping levels and strain, as described herein.

In some embodiments, dilute nitride active layer 405 can include a dilute nitride material. The dilute nitride material can be $Ga_{1-x}In_xN_yAs_{1-y-z}Sb_z$, where x, y and z can be $0 \le x \le 0.4$, $0 < y \le 0.07$ and $0 < z \le 0.2$, respectively. In some embodiments, x, y and z can be $0.01 \le x \le 0.4$, $0.02 \le y \le 0.07$ and $0.001 \le z \le 0.04$, respectively, and the thickness of the dilute nitride active layer can be within a range from 0.2 μm to 10 μm or from 1 μm to 4 μm. In some embodiments, active layer 405 can include quantum well structures to form a dilute nitride active layer. For example, dilute nitride active layer can include GaInNAs/GaAs or GaInNAsSb/GaAsN multiple quantum wells (MQWs). Examples of dilute nitride-based active layers, including compositions and thicknesses, are described in U.S. Pat. Nos. 6,798,809, and 7,645,626, each of which is incorporated by reference in its entirety. The hydrogen diffusion barrier region 407 is shown as a single layer for simplicity. However, it will be understood that hydrogen diffusion barrier region 407 may comprise more than one layer, with differing layer compositions, thicknesses, doping levels and strain, as described herein.

Devices according to FIG. 4 can include VCSELs, resonant cavity enhanced photodetectors (RCEPDs), edge-emitting lasers (EELs), light emitting diodes (LEDs), photodetectors and modulators. In some examples, hydrogen diffusion barrier region 407 can also be a reflector structure and can form part of an overlying distributed Bragg reflector. Hydrogen diffusion barrier region 407 can comprise, for example, semiconductor materials of Groups III and V of the periodic table such as, for example, AlAs, AlGaAs, GaAs, InAs, InGaAs, AlInAs, InGaP, AlInGaP, InGaP, GaP, InP, AlP, AlInP, or AlInGaAs. An example of a reflector is a DBR. A DBR may comprise, for example, a plurality of alternating AlGaAs/GaAs layers, with thicknesses selected to provide a desired reflectivity over a given wavelength range and incident angle. Other reflector designs may also be used. A first portion of the DBR can be formed using an MBE process 415 (to act as the hydrogen diffusion barrier) and a second adjacent overlying portion of the DBR can be formed using an MOCVD process 417. In other examples, hydrogen diffusion barrier region 407 can also be a waveguiding layer and/or a cladding region.

Returning to multijunction solar cells, FIGS. 5A-5D show examples of a 4J solar cell structures with the previously-mentioned additional elements. Further, additional elements may be present in a complete solar cell, such as buffer layers, tunnel junctions, back surface field layers, window layers, emitters, nucleation layers, and front surface field layers. In the examples shown in FIGS. 5A-5D all subcells can be substantially lattice-matched to each other and may be interconnected by tunnel junctions. Multijunction solar cells may also be formed without one or more of the elements listed above.

In each of the embodiments described herein, the tunnel junctions are designed to have minimal light absorption. Light absorbed by tunnel junctions is not converted into current by the solar cell, and thus if the tunnel junctions absorb significant amounts of light, it will not be possible for the efficiencies of the multijunction solar cells to exceed those of the best multijunction junction solar cells. Accordingly, the tunnel junctions must be very thin (for example, less than 40 nm) and/or be made of materials with band gaps equal to or greater than the subcells immediately above the respective tunnel junction. An example of a tunnel junction fitting these criteria is a GaAs/AlGaAs tunnel junction, in which each of the GaAs and AlGaAs layers forming the tunnel junction has a thickness between 5 nm and 40 nm. The GaAs layer can be doped with Te, Se, S and/or Si, and the AlGaAs layer can be doped with C. InGaAs may also be used in the tunnel junctions instead of GaAs and/or AlGaAs. Another example of a suitable tunnel junction is a GaInP/AlGaAs tunnel junction, with similar thicknesses, and where the InGaP layer can be doped with Te, Se, S and/or Si, and the AlGaAs layer can be doped with C.

Various metrics can be used to characterize the quality of an optoelectronic device, including, for example, the Eg/q-Voc, the efficiency over a range of irradiance energies, the open circuit voltage, Voc, and the short circuit current density, Jsc. Those skilled in the art can understand how to extrapolate the Voc and Jsc measured for a junction having a particular dilute nitride base thickness to other junction thicknesses. The Jsc and the Voc are the maximum current density and voltage, respectively, for a solar cell. However, at both of these operating points, the power from the solar cell is zero. The fill factor (FF) is a parameter which, in conjunction with Jsc and Voc, determines the maximum power from a solar cell. The FF is defined as the ratio of the maximum power produced by the solar cell to the product of Voc and Jsc. Graphically, the FF is a measure of the "squareness" of the solar cell and is also the area of the largest rectangle, which will fit within the IV (current-voltage) curve.

Seemingly small improvements in the efficiency of ajunction/subcell can result in significant improvements in the efficiency of a multijunction solar cell. Again, seemingly small improvements in the overall efficiency of a multijunction solar cell can result in dramatic improvements in output power, reduce the area of a solar array, and reduce costs associated with installation, system integration, and deployment.

Solar cell efficiency is important as it directly affects the solar module power output. For example, assuming a 1 m² solar panel having an overall 24% conversion efficiency, if the efficiency of multijunction solar cells used in a module is increased by 1% such as from 40% to 41% under 500 suns, the module output power will increase by about 2.7 kW.

Generally, a solar cell contributes around 20% to the total cost of a solar power module. Higher solar cell efficiency means more cost-effective modules. Fewer solar devices are then needed to generate the same amount of output power, and higher output power with fewer devices leads to reduced system costs, such as costs for mounting racks, hardware, wiring for electrical connections, etc. In addition, by using high efficiency solar cells to generate the same power, less land area, fewer support structures, and lower labor costs are required for installation.

Solar modules are a significant component in spacecraft power systems. Lighter weight and smaller solar modules are always preferred because the lifting cost to launch satellites into orbit is super expensive. Solar cell efficiency is especially important for space power applications to reduce the mass and fuel penalty due to large arrays. The higher specific power (watts generated over solar array mass), which determines how much power one array will generate for a given launch mass, can be achieved with more efficient solar cells because the size and weight of the solar array will be less for the same power output.

As an example, compared to a nominal solar cell having a 30% conversion efficiency, a 1.5% increase in multijunction solar cell efficiency can result in a 4.5% increase in output power, and a 3.5% increase in multijunction solar cell efficiency can result in an 11.5% increase in output power. For a satellite having a 60 kW power requirement, the use of higher efficiency subcells can result in solar cell module cost savings from $0.5 million to $1.5 million, and a reduction in solar array surface area of 6.4 $m^2$ to 15.6 $m^2$, for multijunction solar cells having increased efficiencies of 1.5% and 3.5%, respectively. The overall cost savings will be even greater when costs associated with system integration and launch are taken into consideration.

One important problem to solve in making hybrid epitaxy viable is the potential oxidation or contamination of exposed interface layers as epitaxial growth is interrupted and epiwafers are moved from one reactor to another. Any imperfections at the interface where growth resumes will result in poor overgrown epitaxial material. In production, cluster tools and controlled-atmosphere boxes are employed. A possible solution is the careful design of the epitaxial stack so that interruption of epitaxy occurs at layers that form a protective cap from oxidation. Consider this in the context of the 4-junction (4J) lattice-matched solar cell (FIGS. 1B, 3A, 5A), where the epitaxial material is grown on a p-doped germanium substrate that is oriented in an-off axis crystallographic direction. The bottom junction (or J4 subcell) is created in the germanium substrate using a MOCVD growth technique. The top layer of this J4 structure is a 30 nm- to 150 nm-thick layer of n-doped (In)GaAs (buffer layer), which protects this epiwafer from oxidation as it is removed from the MOCVD reactor and inserted into an MBE chamber for growth of the dilute nitride junction (J3). Epitaxial growth resumes in the MBE chamber by completing the n-doped (In)GaAs buffer layer, then growing a tunnel junction, back surface field and a layer of dilute nitride for J3.

A layer of (In)GaAs and/or (Al)GaAs can be grown over the dilute nitride active layer as an emitter layer, which can also serve as a protective cap layer before the epiwafer is removed from the MBE and loaded into an MOCVD to finish the growth of junctions J2 and J1. (In)GaAs and (Al)GaAs are materials that can also function as a tunnel junction, a back-surface field (BSF), a front surface field (FSF), a window layer and an emitter layer. Consider this in the context of the 4J lattice-matched solar cell shown in FIG. 5A; after growth of the GaInNAsSb base by MBE, an InGaAs emitter and an InGaAs tunnel junction can be grown over the GaInNAsSb base. After that, a hydrogen diffusion barrier region can be grown over the emitter and tunnel junction layers. In some embodiments, the hydrogen diffusion barrier region comprises a material that can be used as a protective layer over the GaInNAsSb before the epiwafer is transferred from the MBE to the MOCVD, and epitaxial growth can be interrupted after growth of at least a portion of, or all of the hydrogen diffusion barrier region by MBE, and epitaxial growth can be interrupted after growth of this protective layer. In some embodiments, an additional protective layer can be deposited on the hydrogen diffusion barrier region. In some embodiments, the hydrogen diffusion barrier region comprises a doped material. In some embodiments, the hydrogen diffusion barrier region comprises a pseudomorphically strained layer. Once the epiwafer is in the MOCVD, growth of subsequent layers may continue.

The hydrogen diffusion barrier region mitigates the effects of hydrogen diffusion into the underlying dilute nitride material during growth of the overlying layers in a MOCVD environment. Hydrogen is known to act as an isolated donor in dilute nitrides, can intentionally passivate dopants by forming complexes with the intentional dopants, and is also known to form complex defects of nitrogen and hydrogen, such as N—H, and N—H—VGa. The presence of hydrogen in dilute nitrides can therefore affect the electrical and optical properties of dilute nitrides. The use of a hydrogen diffusion barrier region prevents the creation of doping passivation-compensation, isolated donors, and/or other defects in the dilute nitride material.

The hydrogen diffusion barrier region can be formed immediately above the tunnel junction (FIG. 3A, FIG. 3B, FIG. 5A, FIG. 5B) or immediately below a tunnel junction (FIG. 2A, FIG. 2B, FIG. 5C, FIG. 5D).

A hydrogen diffusion barrier region can be a single layer or can be more than one layer where each layer can have the same alloy composition or can have different alloy compositions, which may be deposited under the same or different growth conditions. The layers can have the same or different doping levels and/or the same or different strain values. In some embodiments, the hydrogen diffusion barrier region can be adjacent the dilute nitride active layer. In other embodiments, the hydrogen diffusion barrier region in not adjacent the dilute nitride active layer, for example, as will be described in the embodiment shown in FIG. 9. "Adjacent" refers to a semiconductor layer that is directly on or directly grown on another semiconductor layer.

The dilute nitride active layer or layers, the one or more hydrogen diffusion barrier regions, and any intervening layers between the active layer or layers and the one or more hydrogen diffusion barrier regions can be grown by MBE and the overlying semiconductor layer can be grown by MOCVD. The overlying semiconductor layer can comprise GaAs, AlGaAs, InGaAs, InAlP, AlGaInP or InGaP.

Embodiments for the hydrogen diffusion barriers, including compositions, thicknesses, doping concentrations and strain levels will be described in more detail later.

Referring to FIG. 5A in more detail, a p-doped germanium substrate 502 is provided and cleaned to remove native oxides prior to atomic-layer deposition. The substrate may be cleaned, for example, in a gaseous environment such as an $AsH_3$ environment or a $PH_3$ environment. This cleaning step also allows the group V atoms to diffuse into the upper region of germanium. An emitter region is formed as the upper germanium region and is doped with a group V element comprising arsenic or phosphorus, transforming the germanium substrate into an active n-p junction, with a p-doped region and an n-doped region overlying the p-doped region. In the four-cell embodiment shown in FIG. 5A, this cell is referred to as "J4". The extent of group-V diffusion can be influenced by thermal exposure during substrate cleaning, epitaxial growth, and post-growth annealing treatments. In some embodiments, a phosphide layer or an arsenide layer can be deposited on the top surface of substrate 502, with the deposition conditions allowing for diffusion of the group V atoms into substrate 502 to form the n-doped region.

A nucleation layer 504 can be epitaxially grown over the p-doped germanium junction 502. A nucleation layer 504 is epitaxially grown on the top surface of the germanium junction 502. The nucleation layer can be, for example, InGaP. However, other nucleation layers are known and are disclosed, for example, in U.S. Pat. No. 6,380,601B1 and in U.S. Pat. No. 7,339,109 B2, although the nucleation layers disclosed in these publications were not applied to dilute-nitride-based multijunction cells. Nucleation layers used with dilute nitride materials are described in U.S. Application Publication No. 2018/0053874 and in U.S. application Ser. No. 16/276,432 filed on Feb. 14, 2019, each of which is incorporated by reference in its entirety. Nucleation layers can comprise, for example, InGaP, InGaPSb, InAlP, AlP, AlPSb, GaPSb, AlGaPSb, InAlPSb, InAlPBi, InAlPSbBi, AIInGaP, AIInGaPSb, AIInGaPBi, AIInGaPSbBi, AlP, AlPSb, AlPBi, AlPSbBi, AlAsSb, AlAsBi, AlAsSbBi, AlN, AlNSb, AlNBi, or AlNSbBi. Nucleation layer 504 can have a thickness, for example less than 200 nm, less than 100 nm, less than 50 nm, less than 20 nm, less than 10 nm, or less than 1 nm. Nucleation layer 304 can be, for example, from 2 nm to 20 nm thick, from 2 nm to 10 nm, from 2 nm to 5 nm, or from 4 nm to 10 nm. A nucleation layer 504 can be n-doped. A buffer layer 506 can then be epitaxially grown over nucleation layer 504. A buffer layer can comprise (In)GaAs. A (In)GaAs buffer layer can be, for example, from 100 nm to 900 nm thick, from 200 nm to 800 nm thick, from 300 nm to 700 nm thick, or from 400 nm to 600 nm thick. A buffer 506 can be n-doped. The nucleation layer and at least a portion of the buffer layer can be grown using MOCVD.

In some embodiments, after growth of at least a portion of the buffer layer 506, the sample can be transferred to an MBE chamber for subsequent growth of the dilute nitride sub-cell or junction. In some embodiments, buffer layer 506 may be completed by growing several nanometers (e.g., 2 nm to 100 nm) of (In)GaAs using MBE, prior to deposition of the subsequent layers to ensure that a growth interrupt occurs in the buffer layer and is not directly adjacent to a structure such as the overlying tunnel junction. After completion of the buffer layer, a tunnel junction 508 can then be epitaxially grown over buffer layer 506. Tunnel junction 508 can comprise two InGaAs layers, with the first layer 508A having a high n-type doping level, and the second layer 508B having a high p-type doping level. Compositions, thicknesses and doping levels required to form tunnel junctions are known in the art. For example, n-dopants can include Si, Se, and Te and n-type doping levels can range from $1\times10^{19}$ cm$^{-3}$ to $2\times10^{20}$ cm$^{-3}$. P-type dopants can include C and doping levels greater than about $1\times10^{19}$ cm$^{-3}$ and up to $2\times10^{20}$ cm$^{-3}$ can be used. Thicknesses for the doped layers in tunnel junctions can be between about 5 nm and 40 nm.

Sub-cell 501 (referred to as "J3") is then epitaxially deposited on tunnel junction 508. Sub-cell 501 comprises a p-doped InGaAs back surface field layer 510, a p-doped GaInNAsSb base layer 512A, an intrinsic or unintentionally doped base layer 512B and an n-doped InGaAs emitter layer 514. The p-doped layer 512A and layer 512B can comprise, individually, $Ga_{1-x}In_xN_yAs_{1-y-z}Sb_z$, with $0 \le x \le 0.24$, $0.001 \le y \le 0.07$ and $0.001 \le z \le 0.2$, or with $0.08 \le x \le 0.24$, $0.02 \le y \le 0.05$ and $0.001 \le z \le 0.02$, or with $0.07 \le x \le 0.18$, $0.025 \le y \le 0.04$ and $0.001 \le z \le 0.03$, or with $0 \le x \le 0.4$, $0 < y \le 0.07$, and $0 < z \le 0.04$. The p-doped base layer 512A can have a graded doping profile, with the doping level decreasing from the interface with back surface field 310 to the interface with base layer 512B. The intentional doping in base layer 512B can be graded exponentially between $1\times10^{19}$ cm$^{-3}$ and $1\times10^{15}$ cm$^{-3}$, for example between $1\times10^{18}$ and $5\times10^{15}$ cm$^{-3}$, or between $2\times10^{17}$ and $7\times10^{15}$ cm$^{-3}$, where the minimum doping level is greater than or equal to the background doping level of the base layer. Base layer 512B can be an intrinsic layer or an unintentionally doped base layer, with a background doping concentration less than about $1\times10^{16}$ cm$^{-3}$ or less than about $5\times10^{15}$ cm$^{-3}$ or less than about $1\times10^{15}$ cm$^{-3}$. Base layer 512B can also be doped at a fixed doping level of $1\times10^{16}$ cm$^{-3}$ or less. Sub-cell 501 can have a thickness between about 1 micron and 4 microns.

A tunnel junction 516 can then be epitaxially grown over sub-cell 501. Tunnel junction 516 comprises two InGaAs layers, one with high p-type doping, the other with high n-type doping. Compositions, thicknesses and doping levels used to form tunnel junctions are known in the art. For example, typical n-dopants include Si, Se, and Te and n-type doping levels can range between $1\times10^{19}$ cm$^{-3}$ and up to $2\times10^{20}$ cm$^{-3}$. P-type dopants include C and doping levels greater than $1\times10^{19}$ cm$^{-3}$ and up to $2\times10^{20}$ cm$^{-3}$ can be used. Thicknesses for the doped layers in tunnel junctions can be between about 5 nm and 40 nm.

A hydrogen diffusion barrier region 507A can then be epitaxially formed on tunnel junction 516. FIG. 5A shows layer 507A as a single layer. However, it will be understood that hydrogen diffusion barrier region 318 may include more than one material layer. In some embodiments, hydrogen diffusion barrier region 507A comprises an Al-containing layer. In some embodiments, hydrogen diffusion barrier region 507A comprises a doped layer. In some embodiments, hydrogen diffusion barrier region 507A comprises a pseudomorphically strained layer. In some embodiments, hydrogen diffusion barrier region 507A is capped by a layer of GaAs, InGaAs or InGaP, having a thickness, for example, between 1 nm and 50 nm, or between 2 nm and 10 nm, or between 2 nm and 5 nm. In some embodiments, the hydrogen diffusion barrier can also function as a BSF layer for an overlying subcell in a multijunction solar cell (such as layer 518). Embodiments for the hydrogen diffusion barrier regions, including compositions, thicknesses, doping concentrations and strain levels will be described in more detail.

After growth of layer 507A, or at least a portion of layer 507A, the wafer is transferred to an MOCVD chamber for deposition of the remainder of layer 507A (if desired) and the remaining layers to complete the multijunction cell. Sub-cell 503 (referred to as "J2") is then epitaxially formed on hydrogen diffusion barrier region 507A. Sub-cell 503 comprises an Al-containing back surface field layer 518. For example, layer 518 can comprise AlGaAs, or InAlP and can be lattice matched or pseudomorphically strained to the substrate. Sub-cell 503 is completed by deposition of base 520, emitter 522 and front surface field layer 524. A tunnel junction 526 is then epitaxially grown. Compositions, thicknesses and doping levels used to form tunnel junctions are known in the art. By way of example, tunnel junction 526 is shown comprising a GaAs layer and an AlGaAs layer. However, it will be understood that other materials may be used. For example, the tunnel junction may comprise an InGaP layer and/or an AlGaAs layer. Examples of n-dopants for the tunnel junction layers include Si, Se, and Te and n-type doping levels in a range between $1 \times 10^{19}$ cm$^{-3}$ and up to $2 \times 10^{20}$ cm$^{-3}$ can be used. P-type dopants can include C and doping levels in a range between $1 \times 10^{19}$ cm$^{-3}$ and up to $2 \times 10^{20}$ cm$^{-3}$ can be used. Thicknesses for the doped layers in tunnel junctions can be between 5 nm and 40 nm. Sub-cell 505 (J1) is then epitaxially grown, depositing in sequence back surface field layer 528, base layer 530, emitter layer 532, front surface field layer 534, and contact layer 336.

FIG. 5B shows an alternative implementation of a hydrogen diffusion barrier region. After completion of growth of tunnel junction 516, a reflector region 507B is deposited. Reflector region 507 is shown as a single layer. However, it will be understood that reflector layer can include one or more layers with differing compositions, thicknesses and doping levels in order to provide the appropriate optical and/or electrical functionality, and to improve interface quality, electron transport, hole transport and/or other optoelectronic properties. Reflector region 507 can comprise alternating layers of materials having different refractive indices. The refractive index difference between the layers, and the layer thicknesses provides a reflectivity over a desired wavelength range. Reflector region 507 comprises at least two different materials with different refractive indices and at least two different layer thicknesses. In some embodiments, the mirror materials are doped. In some embodiments, at least one material is pseudomorphically strained. Reflector region 507 can comprise, for example semiconductor materials of Groups III and V of the periodic table such as, for example, AlAs, AlGaAs, GaAs, InAs, InGaAs, AlInAs, InGaP, AlInGaP, InGaP, GaP, InP, AlP, AlInP, or AlInGaAs. An example of a reflector is a DBR. A DBR may comprise, for example, a plurality of alternating AlGaAs/GaAs layers, with thicknesses selected to provide a desired reflectivity over a given wavelength range and incident angle. Other reflector designs may also be used. Reflector region 507 can be designed to reflect wavelengths absorbed by the overlying sub-cell 503. Reflector region 507 also serves as a hydrogen diffusion barrier. At least a portion of reflector region 507 can be grown by MBE, after which the epiwafer is transferred to an MOCVD chamber. In some embodiments, reflector region 507 may be completed by MOCVD growth, after which overlying back surface field 518 and the remaining layers can be grown via MOCVD. Further details of embodiments for the hydrogen diffusion barrier region, including compositions, thicknesses, doping concentrations and strain levels will be described more fully later.

The hydrogen diffusion barrier region may also underlie the InGaAs tunnel junction 516, as shown in FIG. 5C. In this embodiment, a window layer 509 grown by MBE overlies emitter 514 and underlies tunnel junction 516. Window region 509 is shown as a single layer. However, it will be understood that window region 509 may include more than one material layer. Window region 509 is configured to function as a hydrogen diffusion barrier region. In some embodiments, window region 509 comprises an Al-containing layer. In some embodiments, window region 509 comprises a doped layer. In some embodiments, window region 509 comprises a pseudomorphically strained layer. In some embodiments, window region 509 is capped by a layer of GaAs, InGaAs or InGaP, having a thickness, for example, between 1 nm and 50 nm, or between 2 nm and 10 nm, or between 2 nm and 5 nm. Embodiments for the hydrogen diffusion barriers, including compositions, thicknesses, doping concentrations and strain levels will be described in more detail.

After MBE growth of window layer 509, or at least a portion of window region 509, MOCVD growth can be used to complete the window layer (if desired) and for the remaining layers of the device.

FIG. 5D shows yet another embodiment of a hydrogen diffusion barrier underlying tunnel junction 516. In this example, emitter region 514 shown in FIG. 5A is replaced by emitter region 515. comprising a hydrogen diffusion barrier region. Emitter region 509 is shown as a single layer. However, it will be understood that emitter layer 515 may include more than one material layer. Emitter region 515 is configured to function as a hydrogen diffusion barrier. In some embodiments, emitter region 515 comprises an Al-containing layer. In some embodiments, emitter region 515 comprises a doped layer. In some embodiments, emitter region 515 comprises a pseudomorphically strained layer. In some embodiments, emitter region 515 is capped by a layer of GaAs, InGaAs or InGaP, having a thickness, for example, between 1 nm and 50 nm, or between 2 nm and 10 nm, or between 2 nm and 5 nm. Embodiments for the hydrogen diffusion barrier regions, including compositions, thicknesses, doping concentrations and strain levels will be described in more detail.

MBE can be used to grow at least a portion of emitter region 515. MOCVD growth can be used to complete growth of emitter region 515 (if desired) and for the remaining layers of the device.

The dilute nitride material is a high-efficiency solar material only if it is processed in particular ways. For example, thermal treatment is needed to activate the material. It is not trivial to determine the specific process step(s) during which thermal treatment must be applied for annealing.

In general, a thermal treatment, such as a rapid thermal treatment (RTA) refers to exposure to a temperature that can range from 600° C. to 900° C. for a duration from 5 seconds to 3 hours. In some cases, there are no limits for temperature and time. Table 1 summarizes typical thermal treatment parameters by deposition method or thermal annealing condition.

TABLE 1

Thermal treatment methods, temperatures and exposure times.

| | Method | | | |
|---|---|---|---|---|
| | MBE | MOCVD | RTA | Oven or furnace |
| Time | 2-3 hours | 0.5-1 hour | 0.1-10 minutes | Any duration |
| Temperature | 600° C.-650° C. | 630° C.-700° C. | 600° C.-900° C. | Any temperature |

Figure 6A:
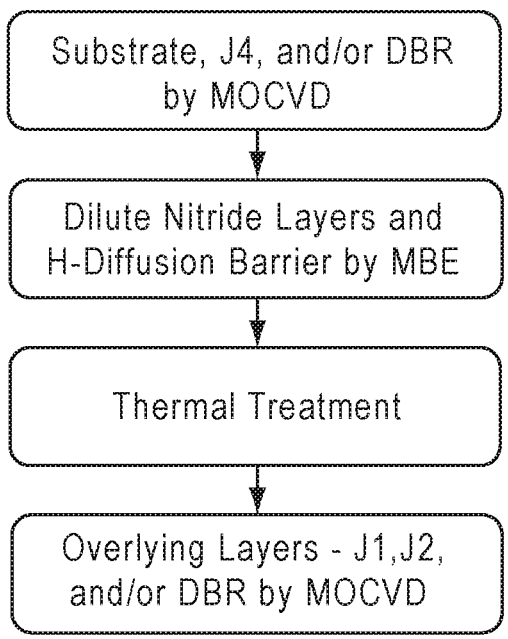
FIG. 6A-6E show process flow steps according to methods provided by the present disclosure.
Figure 6B:
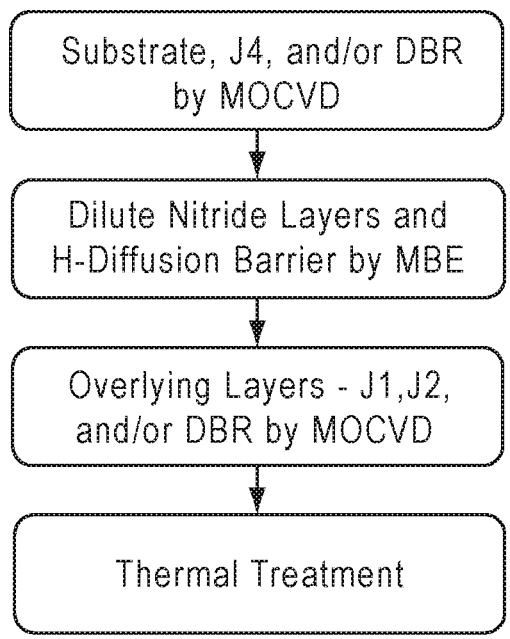

Thermal treatment can damage the surface morphology of a dilute nitride active layer such as a J3 subcell or other dilute nitride active layer such as a bulk layer or a quantum well layer, which has to be of sufficient quality for additional epitaxial growth in the MOCVD reactor. Although it is possible to thermally treat a dilute nitride active layer prior to subsequent epitaxial growth (FIG. 6A) or after all epitaxial growth is completed (FIG. 6B), it is unclear which practice is best to produce a high efficiency device. An increase in haze post-thermal treatment is not uncommon and is indicative of structural defects. Thermal treatment prior to MOCVD growth will create areas with haze in the dilute nitride active layer, which can nucleate structural defects in subsequent epitaxial layers grown on the dilute nitride active layer. These defects can propagate throughout the device structure and thereby decrease device performance. Besides, exposure of the growing epi-wafer in the MOCVD reactor can provide sufficient thermal load to activate the dilute nitride active layer, which would render additional thermal treatment redundant.

An additional consideration for multijunction solar cells grown on an active germanium substrate (FIG. 1) is to design the structure of the upper junctions and to use the growth conditions such that the thermal load is maintained below a threshold that otherwise would cause the bottom dilute nitride subcell (or subcells) to degrade due to excess diffusion of phosphorus into the active germanium substrate. This degradation reduces open circuit voltage (Voc) and the conversion efficiency of the bottom germanium junction. Limiting the thermal load during growth of the upper junctions can be accomplished by a combination of one or more of the following measures: (i) reducing the growth temperature, (ii) reducing the growth time by increasing growth rates; and (iii) reducing the growth time by reducing the thickness of some of the layers in the upper junctions.

Another consideration in multijunction solar cells grown on a germanium or GaAs substrate (FIG. 1) is to design the epitaxial structure and the epitaxial growth conditions of the J2 and J1 junctions above the dilute nitride junction (which is J3 in the 4J solar cell on germanium embodiment, and J3 on the 3J solar cell on GaAs embodiment) to apply enough thermal load during the MOCVD growth of J2 and J1 to fully anneal the dilute nitride junction. For photonic devices, epitaxial growth conditions for an overlying DBR or cladding region can be chosen to apply enough thermal load during the MOCVD growth of the overlying DBR to fully anneal the dilute nitride active layer. In this case, the dilute nitride active layer is fully annealed in situ during the MOCVD growth of the overlying layers and no additional ex-situ thermal treatment is required (FIG. 6E). Delivering the appropriate thermal load to adequately anneal the dilute nitride active layer during the MOCVD growth of the overlying layers can be accomplished by a combination of one or more of the following measures: (i) reducing the growth temperature during the MOCVD growth of upper junction, (ii) reducing the MOCVD growth time by increasing growth rates; and (iii) reducing the MOCVD growth time by reducing the thickness of some of the layers in the upper junctions. Over-annealing the dilute nitride active layer by excessive thermal load during growth of overlying layers such as J2 and J1 or a DBR region will not only degrade the dilute nitride active layer but in the case of a solar cell on germanium, it will also degrade the bottom junction.

As an alternative, one can also apply sufficient thermal load during the MOCVD growth of the overlying layers (J2 and J1 subcells or DBR) to partially or under-anneal the dilute nitride active layer. Delivering the appropriate thermal load to partially or under-anneal the dilute nitride active layer in-situ during the MOCVD growth of the upper junctions can be accomplished by a combination of one or more of the aforementioned measures that pertain to growth temperatures, rates and times. An additional thermal anneal can be performed ex situ after all epitaxial growth is completed, using one of several possible methods including, for example, RTA (rapid thermal anneal), oven baking, or tube furnace annealing.

Figure 6C:
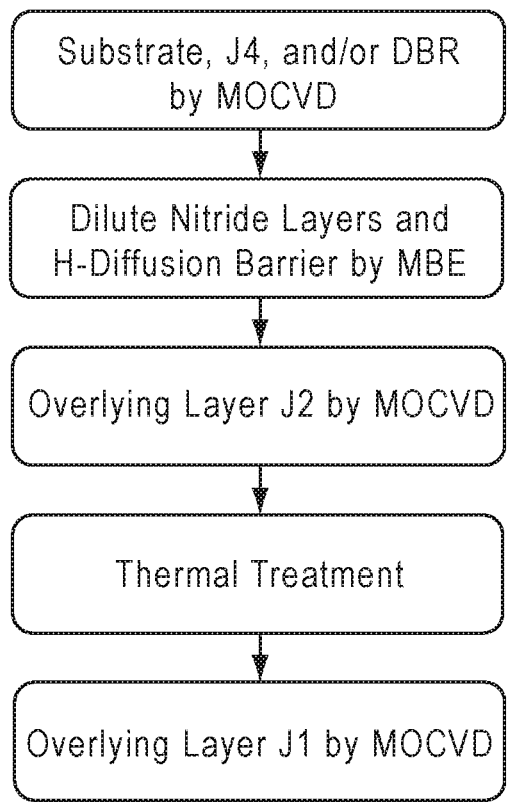
Figure 6D:
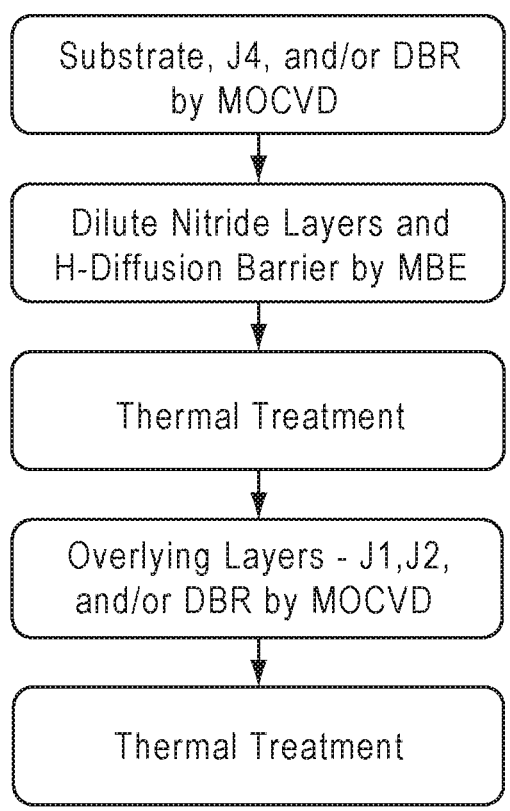
Figure 6E:
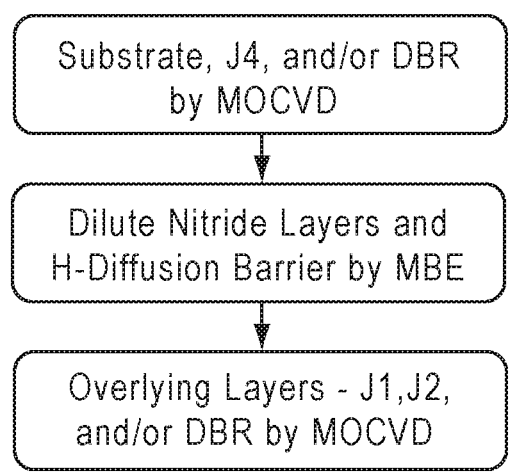

Additional process flows for forming devices are shown in FIG. 6C and FIG. 6D, where thermal treatment steps may be interleaved with epitaxial growth steps.

As mentioned previously, one solution to hydrogen contamination is to protect the dilute nitride with a barrier. Hydrogen getters are materials capable of binding hydrogen gas under low pressure (less than 1 atm) and can be incorporated in the design of a multijunction solar cell. Although it is common practice to liberate absorbed hydrogen by applying thermal treatment post-epitaxial growth (FIGS. 6B-6D), doing so can further worsen the doping profiles already altered by hydrogen diffusion, resulting in even poorer device performance. In any embodiment of a multijunction solar cell that has a layer of dilute nitride, a hydrogen getter material caps the dilute nitride before the epiwafer leaves the low-hydrogen environment of the MBE. Once in the MOCVD reactor, the hydrogen getter preserves the quality of the underlying dilute nitride by absorbing hydrogen gas on its surface.

Embodiments and examples for the hydrogen diffusion barrier regions will now be described in more detail.

A hydrogen diffusion barrier region can have a thickness, for example, from 25 nm to 6 µm, from 50 nm to 4 µm, from 100 nm to 2 µm, from 100 nm to 1 µm, from 100 nm to 500 nm, or from 1 µm to 3 µm.

In certain embodiments, at least one aluminum-containing layer is used as the hydrogen diffusion barrier. Examples of suitable aluminum-containing layers include AlGaAs, AlGaAsSb, AlGaAsBi, AlInP, AlInGaP, AlInGaPSb, AlInGaPBi, AlInGaAs, AlInGaAsSb, AlInGaAsBi, AlN, AlNSb, and AlNBi. A thin layer of aluminum material can be used if the aluminum content is sufficiently high, and a thick layer of aluminum material can be used if the percentage of aluminum is low. The at least one aluminum-containing layer can comprise AlGaAs or InAlP. In some examples, AlGaAs is used as a hydrogen diffusion barrier. Using AlGaAs as an example, the thickness of AlGaAs ranges from 100 nm to 5 microns, such as, for example, from 100 nm to 2 µm, from 100 nm to 1 µm, from 100 nm to 500 nm, or from 100 nm to 200 nm. AlGaAs can comprise, for example, $Al_xGa_{1-x}As$ with an aluminum content where $0.05 < x \leq 1$, such as $0.05 < x \leq 0.8$, or $0.05 < x \leq 0.6$, or $0.05 < x \leq 0.5$, or $0.05 < x \leq 0.4$, $0.05 < x \leq 0.3$, or $0.1 < x \leq 0.4$. An aluminum-containing material can comprise, for example, from 5 mol % to 100 mol % of aluminum, from 10 mol % to 80 mol %, from 20 mol % to 60 mol %, from 25 mol % to 55 mol %, from 30 at % to 50 mol %, or from 35 mol % to 45 mol %, where mol % is based on the fraction of group-III atoms in the aluminum-containing material.

An aluminum-containing reflector region can comprise at least two different materials with different refractive indices and at least two different layer thicknesses, with at least one material comprising Al. The aluminum-containing reflector region can comprise, for example semiconductor materials of Groups III and V of the periodic table such as, for example, AlAs, AlGaAs, GaAs, InAs, InGaAs, AlInAs, InGaP, AlInGaP, InGaP, GaP, InP, AlP, AlInP, or AlInGaAs, with at least one layer of the mirror layers comprising Al. An aluminum-containing reflector region can have a thickness, for example, from 100 nm and 6 microns.

An aluminum-free layer can overlie and be adjacent to an aluminum-containing layer. The aluminum-free layer can have a thickness, for example, from 1 nm to 200 nm, from 1 nm to 100 nm, from 5 nm to 75 nm, from 10 nm to 50 nm, or from 10 nm to 30 nm. An aluminum-free layer can comprise, for example, GaP, GaAs, InGaP, GaAsP, or InGaAsP, InGaPSb or InGaAsSb. The aluminum-free layer can be a functional layer such as, for example, a window layer or a mirror layer or an emitter layer of a solar cell.

In certain embodiments, a hydrogen diffusion barrier region does not comprise an aluminum-containing layer, such as GaP, GaAs, InGaP, GaAsP, InGaAsP, InGaAsSb or InGaPSb.

In other embodiments, at least one doped layer is used as the hydrogen diffusion barrier. P-type dopants include C, Be and Zn. N-type dopants include Si, Se and Te. The incorporation of dopants into III-V compound semiconductor devices can introduce defects. Furthermore, it is known that dopants and defects can form complexes with H. Complexing with a dopant can form electrically inactive centers. This behavior in a layer overlying a dilute nitride active layer can result in the hydrogen diffusion barrier region effectively gettering the hydrogen, preventing diffusion into the underlying dilute nitride active layers, provided that a suitable doping concentration and layer thickness is used. In one embodiment, carbon doping is used. Carbon preferentially substitutes for As in materials such as GaAs, AlGaAs and InGaAs, and its low diffusivity and high solubility make it an ideal dopant, with accepter concentrations as high as several $10^{20}$ cm$^{-3}$ achievable using MBE growth. Hydrogen is known to passivate C dopants, forming $C_{As}$—H pairs. Doping levels in a range between about $10^{16}$ cm$^{-3}$ and $2 \times 10^{20}$ cm$^{-3}$ or between $10^{17}$ cm$^{-3}$ and $10^{19}$ cm$^{-3}$ with layer thicknesses between 50 nm and 6 µm, or between 100 nm and 5 µm or between 200 nm and 3 µm or between 500 nm and 2 µm can be used to provide a total number of dopants within the hydrogen diffusion barrier region. In some embodiments, the doping concentration can be graded within the layer. Hydrogen has been observed to passivate up to 60% of C. Passivation of other dopants and defects has also been observed and can also be used in a similar fashion. Thus, by including a suitable concentration of dopants, hydrogen can be gettered within the hydrogen diffusion barrier region, reducing or eliminating hydrogen diffusion into the underlying dilute nitride active layers, while allowing a sufficient active doping level to remain that allows electrical functionality to be preserved within the dilute nitride active layer. Compositions for the doped hydrogen diffusion barrier layer can include GaAs, GaAsP, InGaAs, GaP, InGaP, InGaAsP, AlP, InAlP, or AlGaInP.

In other embodiments, at least one nitrogen-containing layer is used as the hydrogen diffusion barrier. Nitrogen containing layers include GaAsN, AlGaAsN, GaInAsN, GaN, AlN, AlNSb, GaNSb, GaNAsSb, GaInNAsSb, GaNBi and AlNBi. The bandgap for the nitrogen-containing layer is larger than the bandgap of the dilute nitride active layer or layers, such as a dilute nitride base layer of a photovoltaic subcell, or a dilute nitride quantum well. A nitrogen-containing material can comprise, for example, from 0.5 mol % to 3 mol % of nitrogen, or from 1 mol % to 2 mol %, where mol % is based on the fraction of group-V atoms in the nitrogen-containing material. In a photonic device such as a laser, nitrogen can be included in the waveguiding or cladding region overlying an active dilute nitride quantum well region, preventing hydrogen diffusion into the quantum wells. In a solar cell, a nitrogen-containing layer can form a window layer or an emitter layer overlying a dilute nitride base layer (absorbing region). The presence of small levels of nitrogen within a material can affect the local potential in the material as well as introduce defects which are known to form complexes with hydrogen, thus preventing the diffusion of H into the underlying dilute nitride active layer that provides the optical and electrical functionality for the device.

Figure 7:
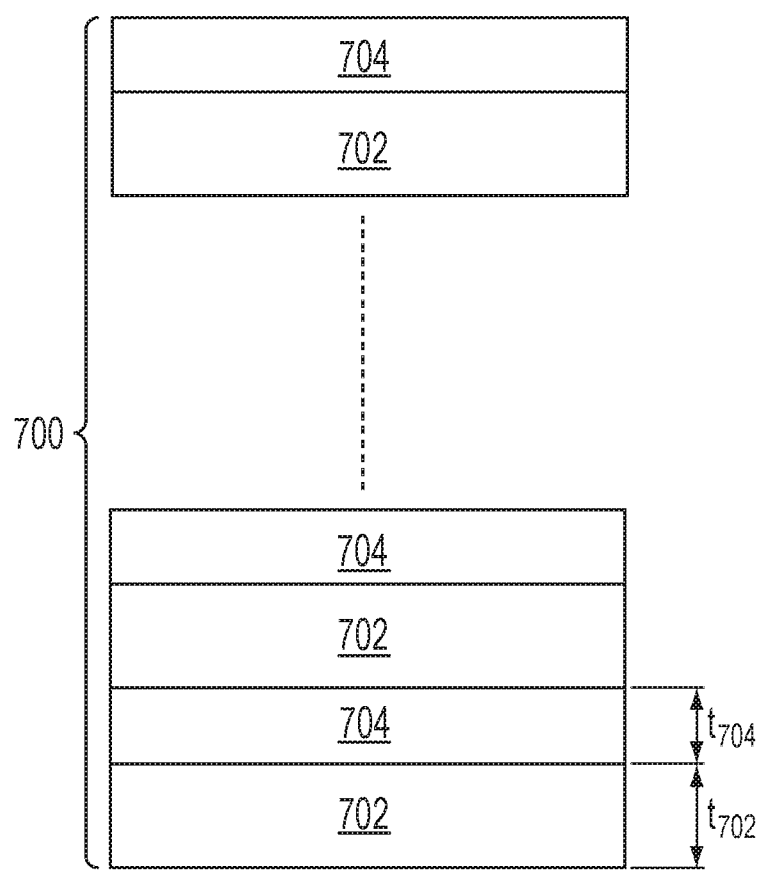
FIG. 7 shows a cross section of a strained layer superlattice hydrogen diffusion barrier.

In other embodiments, at least one strained layer is used as the hydrogen diffusion barrier. U.S. application Ser. No. 16/276,432 filed on Feb. 14, 2019, provides nucleation layers grown on Ge that also prevent the diffusion of group V elements into the Ge substrate. These layers comprise InAlPSb, where bond-strength and strain effects (such as in AlP/InAlP layers) are believed to control the level of hydrogen diffusion. To be able to prevent hydrogen diffusion, different strained structures can be used, for example, strained layer superlattices (SLSs). FIG. 7 shows a cross section of a SLS comprising two alternating layers. SLS 700 comprises adjacent layers of a first layer 702, with a first composition and a first thickness $t_{702}$, and a second layer 704 with a second composition and a second thickness $t_{704}$. One layer is in compressive strain, while the other is in tensile strain. The composition of the adjacent layers is different. M pairs of layers can be used to form the superlattice, where M is an integer determined by the thickness of the layer pair and the total desired thickness of the superlattice. The strain per layer pair is minimized such that multiple pairs can be grown pseudomorphically to form the hydrogen diffusion barrier. The thickness of each layer is between about 0.5 nm and 30 nm, with the maximum layer thickness less than or equal to the critical thickness of the layer, which is determined by the level of strain within the material layer. A layer thickness exceeding the critical thickness relieves the strain energy via dislocations, whereas layers with thicknesses up to the critical thickness are grown pseudomorphically.

The SLS can comprise at least two different layer types having different compositions, strains, and thicknesses. For example, the SLS can comprise three different layer types or four different layer types. The total thickness of the SLS can be between 50 nm and 6 µm. For example, the total thickness can be between 100 nm and 5 µm, or between 200 nm and 4 µm, or between 500 nm and 3 µm.

Examples of layers that can be used (with strain indicated with respect to growth of layers on a GaAs or Ge substrate) include AlP (tensile strain), GaP (tensile strain), InAlP (which can be designed to be in tensile strain or in compressive strain), InGaP (which can be designed to be in tensile strain or in compressive strain) and InGaAsP (which can also be designed to be in tensile strain or in compressive strain). The SLS is optically transparent to wavelengths of light absorbed or emitted by the dilute nitride active layer. Examples of nitrogen-containing layers that can be used include GaAsN (tensile strain) and InGaAsN (compressive strain), where the bandgap of the nitrogen-containing layer is larger than the dilute nitride active layer, such as a dilute nitride base layer of a photovoltaic subcell, or a dilute nitride quantum well. Combinations of these materials can also be used. As hydrogen starts to diffuse through the layer, strain within the layers can locally affect the potential. Additionally, changes in the separation between adjacent atoms within the superlattice can increase the activation energy for hydrogen diffusion, thereby reducing the hydrogen diffusion through the superlattice. High bond strength within the superlattice such as between, for example, Al—P or Al—Sb can also result in reduced diffusion. The strain of a layer within the SLS can be between +/−3.5% or between +/−3% or between +/−2% or between +/−1%, with respect to the lattice constant of the device and substrate. For example, a SLS grown on GaAs may comprise $In_xAl_{1-x}P$ and $In_yAl_{1-y}P$, with x=0.12 and y=0.84 for layers with tensile and compressive strain of about 2.5%, respectively, or with x=0.34 and y=0.62 for layers with tensile and compressive strain of about 1%, respectively.

For example, a SLS grown on Ge may comprise $In_xGa_{1-x}P$ and $In_yGa_{1-y}P$, with x=0.36 and y=0.64 for layers with tensile and compressive strain of about 1%, or with x=0.3 and y=0.71 for layers with tensile and compressive strain of about 1.5%.

Layer compositions of alloys, including AlP, GaP, InAlP, InGaP, InGaAsP, GaAsN, InGaAsN, GaNAsSb, InGaNAsSb, InAlPSb, InGaPSb, AlInGaAsSb and AlInGaPSb may also be chosen that are either in tensile strain or compressive strain with respect to substrates such as Si, Ge, GaAs, InP and GaSb.

The higher the strain value, the lower the critical thickness. Strain balancing between the adjacent layers allows superlattice structures to be growth with a thickness greater than the critical thickness of a single layer, without introducing defects into the material. A SLS can be used to form reflectors such as DBRs.

Figure 8:
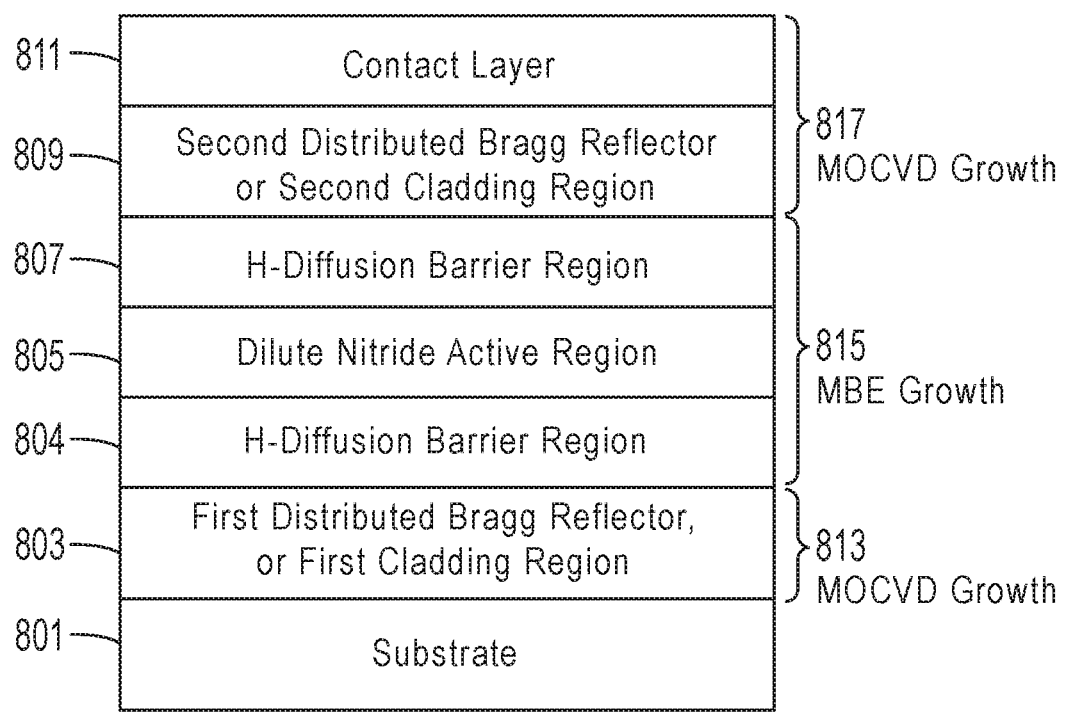
FIG. 8 shows a cross-section of an embodiment of a photonic device comprising a dilute nitride active layer, a hydrogen diffusion barrier region underlying the dilute nitride active layer and a hydrogen diffusion barrier region overlying the dilute nitride active layer.

FIG. 8 shows a simplified cross-section of a photonic device according to an embodiment of the invention. The photonic device comprises a substrate 801 such as GaAs, Ge, or a buffered substrate having a lattice constant approximately equal to the lattice constant for GaAs. A first cladding region or a first reflector such as a DBR 803 can be grown using an MOCVD process 813. At least a portion of the first hydrogen diffusion barrier region 804 overlying DBR/cladding region 803 and underlying a dilute nitride active layer 805 is grown using an MBE process 815. The hydrogen diffusion barrier region 804 is shown as a single layer for simplicity. However, it will be understood that hydrogen diffusion barrier region 804 may comprise more than one layer, with differing layer compositions, thicknesses, doping levels and strain, as described herein. In some examples, hydrogen diffusion barrier region 804 can also be a waveguiding layer and/or a cladding region, or part of a DBR. MBE process 815 is also used to grow a dilute nitride active layer 805 and at least a portion of the overlying hydrogen diffusion barrier region 807. The remaining overlying layers (second cladding region 809, top contact layer 811) and a portion of the H-diffusion barrier region 807 (as required) can be grown using an MOCVD process (817), allowing the MBE/MOCVD growth interface to be buried in the hydrogen diffusion barrier region 807. The overlying layer 809 can also be a second reflector, such as a DBR. The dilute nitride active layer 805 is shown as a single layer for simplicity. However, it will be understood that dilute nitride active layer 805 may comprise more than one layer, with differing layer compositions, thicknesses, doping levels and strain, as described herein. The hydrogen diffusion barrier region 807 is shown as a single layer for simplicity. However, it will be understood that hydrogen diffusion barrier region 807 may comprise more than one layer, with differing layer compositions, thicknesses, doping levels and strain, as described herein.

In some embodiments, dilute nitride active region 805 can include a dilute nitride material. The dilute nitride material can be, for example, $Ga_{1-x}In_xN_yAs_{1-y-z}Sb_z$, where x, y and z can be 0≤x≤0.4, 0<y≤0.07 and 0<z≤0.2, respectively. In some embodiments, x, y and z can be 0.01≤x≤0.4, 0.02≤y≤0.07 and 0.001≤z≤0.04, respectively, and the thickness of the dilute nitride active region can be within a range, for example, from 0.2 μm to 10 μm or from 1 μm to 4 μm. In some embodiments, dilute nitride active region 805 can include quantum well structures to form a dilute nitride active layer. For example, a dilute nitride-based active region can include GaInNAs/GaAs or GaInNAsSb/GaAsN multiple quantum wells (MQWs). Examples of dilute nitride-based active regions, including compositions and thicknesses, are described, for example, in U.S. Pat. Nos. 6,798,809, and 7,645,626, each of which is incorporated by reference in its entirety. The dilute nitride material for a quantum well can be, for example, $Ga_{1-a}In_aN_bAs_cSb_c$, where a, b, and c can be 0≤a≤0.45, 0<b≤0.07 and 0≤c≤0.4, respectively. Several quantum wells may be used, separated by GaAs or GaAsN barriers that provide electron and hole confinement for the quantum wells. Devices according to FIG. 4 can include VCSELs, resonant cavity enhanced photodetectors (RCEPDs), edge-emitting lasers (EELs), light emitting diodes (LEDs), photodetectors, avalanche photodetectors and modulators.

Referring to FIG. 8, hydrogen diffusion barrier region 807 can also be a reflector structure and can form part of an overlying DBR. Hydrogen diffusion barrier region 807 can comprise, for example, semiconductor materials of Groups III and V of the periodic table such as, for example, AlAs, AlGaAs, GaAs, InAs, InGaAs, AlInAs, InGaP, AlInGaP, InGaP, GaP, InP, AlP, AlInP, or AlInGaAs. An example of a reflector is a DBR. A DBR may comprise, for example, a plurality of alternating AlGaAs/GaAs layers, with thicknesses selected to provide a desired reflectivity over a given wavelength range and incident angle. Other reflector designs may also be used. A first portion of the DBR can be formed using an MBE process 415 (to act as the hydrogen diffusion barrier region) and a second adjacent overlying portion of the DBR can be formed using an MOCVD process 817. In other examples, hydrogen diffusion barrier region 807 can also be a waveguiding layer and/or a cladding region.

Figure 9:
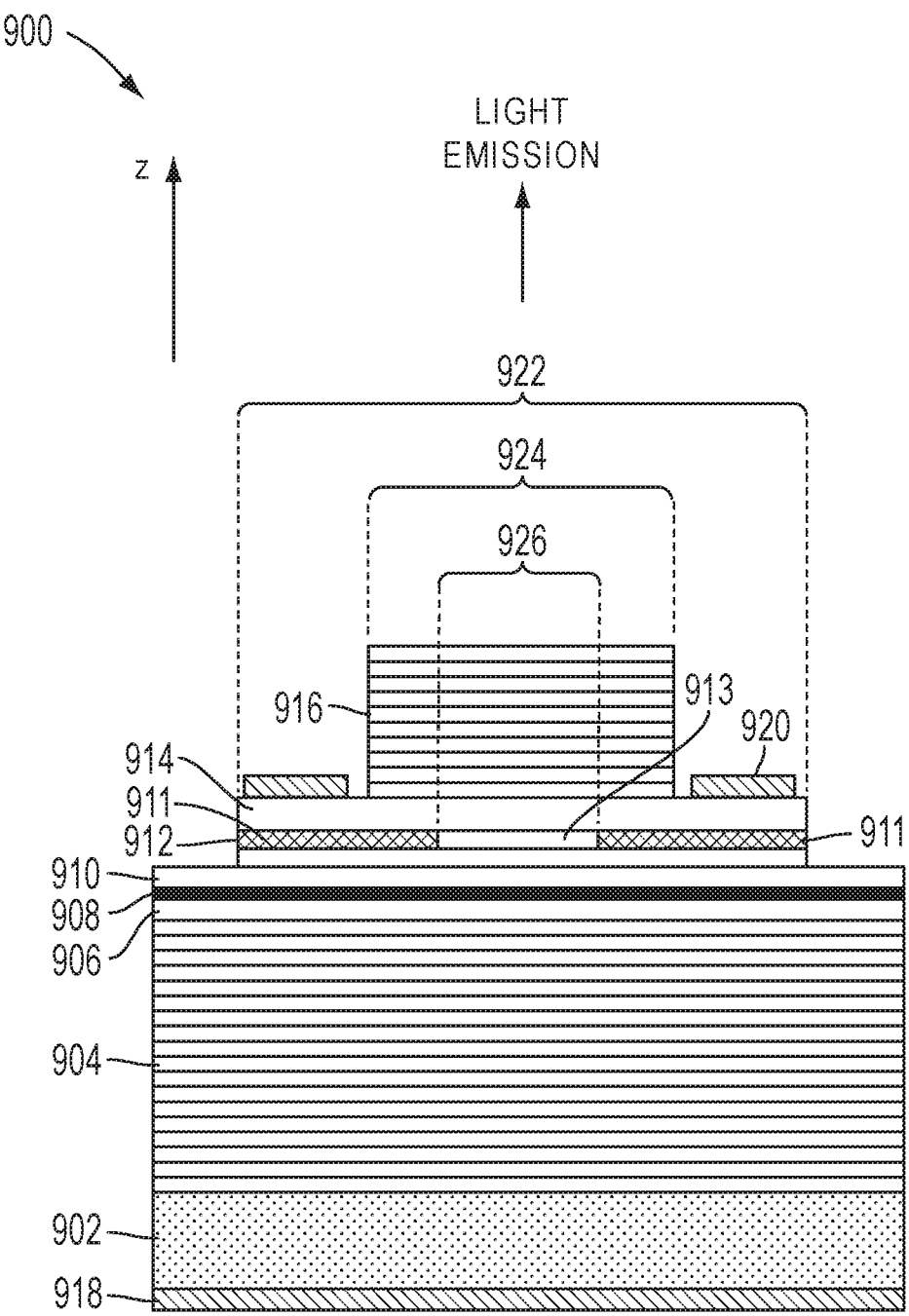
FIG. 9 shows a cross section of a vertical-cavity surface-emitting laser comprising a dilute nitride active layer and a hydrogen diffusion barrier region overlying the dilute nitride active layer.

FIG. 9 shows a cross-section of a vertical-cavity surface-emitting laser (VCSEL) 900 according to an embodiment of the present disclosure. VCSEL 900 is shown to include a substrate 902, a first reflector layered structure 904 overlying the substrate 902; a first spacer region 906 overlying the first reflector region; a dilute nitride active layer 908 overlying the first spacer region 906; a second spacer region 910 overlying the dilute nitride active layer 908; a confinement layer 912 overlying second spacer region 910; a contacting layer 914 overlying confinement layer 912 (having a first portion 911 and a second portion 913); and a second reflector region 916 overlying contacting layer 914. The spacer region 906, dilute nitride active layer 908, and spacer region 910 define a cavity, which has an associated cavity resonance wavelength. The substrate 902 is made from a semiconductor material possessing a corresponding lattice constant. The substrate 902 can include gallium arsenide (GaAs), or indium phosphide (InP), but other semiconductor substrates such as gallium antimonide (GaSb), germanium (Ge), silicon (Si) or an epitaxially grown material (such as a ternary or quaternary semiconductor), or a buffered or composite substrate can also be used. The lattice constant of the substrate 902 is judiciously chosen to minimize defects in materials subsequently grown thereon. The reflector (or mirror) 904 is typically a semiconductor DBR with a lattice matched to that of the substrate 902. A DBR is a periodic structure formed from alternating materials with different refractive indices that can be used to achieve high reflection within a range of frequencies or wavelengths. The thicknesses of the layers are chosen to be an integer multiple of the quarter wavelength, based on a desired design wavelength $\lambda_0$. That is, the thickness of a layer is chosen to be an integer multiple of $\lambda_0/4n$, where n is the refractive index of the material at wavelength $\lambda_0$. A DBR can include, for example semiconductor materials of Groups III and V of the periodic table such as, for example, AlAs, AlGaAs, GaAs, InAs, GaInAs, AlInAs, InGaP, AlInGaP, InGaP, InGaAsP, GaP, InP, AlP, AlInP, or AlInGaAs. When formed on a GaAs substrate, the DBR is formed using two different compositions for AlGaAs. Mirror 904 can also be doped with an n-type dopant or a p-type dopant to facilitate current conduction through the device structure. Mirror layer 904 may be grown using MBE or MOCVD. A spacer region 906, such as AlGaAs or AlGaInP may be formed overlying the first mirror 904. Dilute nitride active layer 908 is formed overlying spacer layer 906 and includes a material capable of emitting a substantial amount of light at a desired wavelength of operation. It will be understood that dilute nitride active layer 908 can include various light emitting structures, such as quantum dots, quantum wells, or the like, which substantially improve a light emitting efficiency of VCSEL 900. For a GaAs substrate, the dilute nitride active layer 908 can include a material that can emit light between a wavelength of about 0.62 µm and 1.6 µm. Dilute nitride active layers may be used to emit light between wavelengths of about 1.1 µm and 1.6 µm. Active region 908 can include more than one material layer but is illustrated as including a single layer in this embodiment for simplicity and ease of discussion. For example, dilute nitride-based active regions can include GaInNAs/GaAs or GaInNAsSb/GaAsN multiple quantum wells (MQWs). Examples of active regions are described in U.S. Pat. Nos. 6,798,809 and 7,645,626, each of which is incorporated by reference in its entirety. A spacer region 910, such as AlGaAs or AlGaInP may be formed overlying dilute nitride active region 908. A confinement layer 912 may be formed overlying spacer region 910. In order to have efficient VCSEL operation, a method of confining the current laterally and/or confining the optical field laterally (providing waveguiding) is required, thus it is necessary to form a confinement region within VCSEL 900. In the example shown, confinement layer 912 is formed within VCSEL 900 and has a first portion (confining region 911) and a second portion (aperture 913). Portions 911 and 913 can have different material properties to provide waveguiding and/or to define a region for current injection such that lasing occurs in an aperture region 913 within confinement layer 912.

Methods of forming confining regions include, for example, oxidation, ion implantation, semiconductor etching, semiconductor regrowth, deposition of other materials and combinations thereof. In the example shown, confining region 911 is formed using oxidation to produce a highly resistive region with a low refractive index, while defining the low resistivity aperture 913 through which current can flow. Devices with oxide-confined apertures can have very low threshold currents. Aperture 913 is typically circular, so as to form a circular current injection region and an associated output beam from VCSEL 900, although other shaped apertures such as squares, or rectangles or diamonds may also be used. Aperture 913 has a first dimension 926, which in the case of a circular aperture is the diameter. Contact layer 914 may be formed overlying confining layer 912. Contact layer 914 can include more than one material layer but is illustrated as including a single layer. Contact layer 914 is doped with a p-type dopant or an n-type dopant, the doping type being opposite to the doping type of first mirror 904 in order to form a p-n junction and to facilitate current conduction through the device structure. The doping for contact layer 914 may be a constant doping level throughout the layer or may comprise regions of high doping such as a delta-doped spike, and low doping to facilitate current spreading and current injection into underlying aperture region 913. Examples of p-type dopants for contact layer 914 include Be, C and Zn. Examples of n-type dopants for contact layer 914 include Si, Se and Te. Layers 906, 908, 910, 912 and at least a portion of layer 914 may be grown using MBE. Contact layer 914 is described further below.

A second reflector (or mirror) 916 may be formed overlying contact layer 914. Second mirror 916 is typically a DBR and is similar in design to first mirror 904. When formed on a GaAs substrate, the DBR is formed using two different compositions for AlGaAs. Second reflector 916 may be grown using MOCVD. VCSEL 900 is completed by a first metal contact 918 formed on substrate 902 and a second metal contact 920 formed on contact layer 914. In the example shown, light emission occurs through the top surface of reflector 916, as shown. In other examples, light can be emitted through the bottom surface of substrate 902 through an aperture formed in bottom contact 918.

In order to form the device, and in particular, the confinement and aperture regions, a first mesa structure 922 is etched using standard semiconductor etch methods, in order to expose a higher aluminum-containing layer or layers for oxidation, which can be achieved using known methods. For devices formed on a GaAs substrate, the layer or layers for oxidation typically include $Al_yGa_{1-y}As$, where y is greater than 0.9. The oxidation process forms confinement region 911 that has (a) a low refractive index and (b) high resistivity, when compared to the unoxidized aperture region 913, and therefore provides both optical and electrical confinement.

In order to form an electrical contact to contact layer 914, a second mesa structure 924 is etched using standard semiconductor etch methods, exposing the top surface of contact layer 914, allowing metal contact 920 to be formed on contact layer 914 using standard techniques. In this embodiment, contact layer 914 may also function as a hydrogen diffusion barrier. Contact layer overlies dilute nitride active layer 908 and is adjacent to confining layer 912. Layers 908, 910, 912 and 914 are all grown using MBE.

In some embodiments, doping is used within the contact layer, the hydrogen from subsequent MOCVD growth of overlying layers partially passivating the dopants, preventing hydrogen diffusion into the dilute nitride active layer 908, while maintaining an acceptable number of dopants for the layer to function as a contacting layer. In some embodiments the doping for contact layer 914 is carbon. In some embodiments, the doping level for contact layer 914 is carbon. In some embodiments, the doping level lies between $10^{17}$ cm$^{-3}$ and $2 \times 10^{20}$ cm$^{-3}$ or between $5 \times 10^{17}$ cm$^{-3}$ and $5 \times 10^{19}$ cm$^{-3}$. The thickness for contact layer 914 can be between 25 nm and 1 µm. Contact layer 914 may also be grown as a superlattice, using for example sublayers with different doping levels between about $10^{17}$ cm$^{-3}$ and $2 \times 10^{20}$ cm$^{-3}$, with each sublayer having a thickness of at least 1 nm, the plurality of sublayers providing a thickness for contact layer 914 between 25 nm and 1 µm.

In some embodiments, contact layer 914 includes at least one nitrogen-containing layer that also acts as a hydrogen diffusion barrier region. Nitrogen containing layers that may be lattice matched or pseudomorphically strained with respect to a GaAs substrate include GaAsN, AlGaAsN, GaInAsN, AlNSb, GaNSb, GaInNAsSb, GaNAsSb, GaInNAsBi, GaNAsBi, GaNBi and AlNBi. The bandgap for the nitrogen-containing contact layer is larger than the bandgap of the dilute nitride active layer 908 such that it does not absorb light emitted by dilute nitride active layer 908. In some embodiments, the dilute nitride material for contact layer can be $Ga_{1-p}In_pN_qAs_{1-q-r}Sb_r$, where p, q and r can be $0 \leq p < 0.4$, $0 < q < 0.07$ and $0 < r < 0.2$, respectively. Contact layer 914 may also be grown as a SLS, using, for example, sublayers of GaAsN (tensile strain) and InGaAsN (compressive strain), with each sublayer having a thickness of at least 1 nm, the plurality of sublayers providing a thickness for contact layer 914 between 25 nm and 1 µm. The doping of each sublayer may also be different to facilitate current spreading, facilitate electrical contacting and provide a hydrogen diffusion barrier.

While this example shows a hydrogen diffusion barrier region implemented using a contact layer within the device, the hydrogen diffusion barrier region may also be implemented in other layers, such as the DBR layers that form part of second reflector region 916 overlying the contact layer 914. To function as a hydrogen diffusion barrier, such layers are grown using MBE, while the remaining overlying DBR layers are grown using MOCVD.

In some embodiments, the substrate on which the semiconductor layers are grown can have a miscut. For example, the substrate can be a GaAs or a Ge substrate oriented (100) with a miscut between 2 and 10 degrees towards the nearest (110) direction.

In some embodiments, the above-described parameters of layer thickness, composition, doping, strain and substrate miscut can be used in combination to form a hydrogen diffusion barrier region, with at least two of the parameters of layer thickness, composition, doping, strain and substrate miscut selected to provide a hydrogen diffusion barrier.

Changes in performance of the dilute nitride is layers believed to be caused by hydrogen diffusion from the MOCVD growth environment into the dilute nitride material. The presence of nitrogen in the dilute nitride semiconductor can introduce strong localized potentials due to the large electronegativity of N compared to As and Sb, which can attract hydrogen. Hydrogen diffusion from MOCVD growth is also known to cause effects such as dopant passivation-compensation, introduction of isolated donors, and may cause other defects such as complex defects of nitrogen and hydrogen. These effects can change the doping profile of the dilute nitride material, resulting in degradation of the electrical and optical performance of a sub-cell. In any embodiment of a multijunction solar cell or a photonic device such as a VCSEL that has a layer of dilute nitride material, a hydrogen getter material (or diffusion barrier material) caps the dilute nitride before the epiwafer is removed from the low-hydrogen environment of the MBE system. Once in the MOCVD system, the hydrogen getter preserves the quality of the underlying dilute nitride by absorbing hydrogen gas on its surface or within the layer, thus preventing diffusion of hydrogen into the underlying dilute nitride active layer. A structure comprising a hydrogen diffusion barrier region overlying a dilute nitride active layer can reduce the dopant passivation-compensation in the dilute nitride active layer, for example, to less than $1\times10^{16}$ cm$^{-3}$, less than $1\times10^{15}$ cm$^{-3}$, or less than the background doping level of the dilute nitride active layer. A structure comprising a hydrogen diffusion barrier region overlying a dilute nitride active layer can reduce the introduction of isolated donors and other defects such as complex defects of nitrogen and hydrogen into the dilute nitride active layer, for example, to less than $1\times10^{16}$ cm$^{-3}$, less than $1\times10^{15}$ cm$^{-3}$, or less than the background doping level of the dilute nitride active layer. Background doping concentrations, also referred to as the dopant passivation level, for dilute nitride active layers can be less than $5\times10^{16}$ cm$^{-3}$ or less than $1\times10^{16}$ cm$^{-3}$ or less than $1\times10^{15}$ cm$^{-3}$. Background doping levels and doping passivation levels can be measured using known measurement techniques such as electrochemical capacitance-voltage (ECV) profiling. Defect densities can be measured using known measurement techniques including deep-level transient spectroscopy (DLTS), and thermally stimulated current and capacitance measurements (TSM). A dilute nitride active layer can have a defect density, for example, less than $5\times10^{16}$ cm$^{-3}$, less than $1\times10^{16}$ cm$^{-3}$, or less than $1\times10^{15}$ cm$^{-3}$. Hydrogen incorporation levels within the as-grown MOCVD-grown layers may exceed $1\times10^{16}$ cm$^{-3}$ or may exceed $5\times10^{16}$ cm$^{-3}$ or may exceed the defect density level of the dilute nitride active layer.

Additionally, hydrogen within an underlying MOCVD-layer may diffuse into the MBE-grown materials during MBE growth. A hydrogen getter material (or diffusion barrier material) may therefore be grown before the growth of dilute nitride active layers or regions, preserving the quality of an overlying dilute nitride by absorbing hydrogen gas at its surface or within the layer thus preventing diffusion of hydrogen from an underlying MOCVD-grown layer into the overlying dilute nitride active layer. Also, hydrogen from underlying and overlying MOCVD layers may diffuse into the MBE-grown materials during post-processing steps such as thermal annealing. A hydrogen diffusion barrier may therefore prevent the diffusion of hydrogen into the dilute nitride active layer.

High performance multijunction solar cells provided by the present disclosure can be characterized by an open circuit voltage Voc greater than 3.0 V, a fill factor greater than 75%, a short circuit current density Jsc greater than 13 mA/cm$^2$, an efficiency greater than 25%, an Eg/q-Voc greater than 0.5, measured using a 1 sun AM1.5D source at a junction temperature of 25° C.

To fabricate solar cells provided by the present disclosure, a plurality of layers is deposited on a substrate in a first materials deposition chamber. The plurality of layers may include etch stop layers, release layers (i.e., layers designed to release the semiconductor layers from the substrate when a specific process sequence, such as chemical etching, is applied), contact layers such as lateral conduction layers, buffer layers, or other semiconductor layers. For example, the sequence of layers deposited can be a buffer layer(s), then a release layer(s), and then a lateral conduction or contact layer(s). Next the substrate can be transferred to a second materials deposition chamber where one or more junctions are deposited on top of the existing semiconductor layers. The substrate may then be transferred to either the first materials deposition chamber or to a third materials deposition chamber for deposition of one or more junctions and then deposition of one or more contact layers. Tunnel junctions are also formed between the junctions.

The movement of the substrate and semiconductor layers from one materials deposition chamber to another is referred to as a transfer. For example, a substrate can be placed in a first materials deposition chamber, and then the buffer layer(s) and the bottom junction(s) can be deposited. Then the substrate and semiconductor layers can be transferred to a second materials deposition chamber where the remaining junctions are deposited. The transfer may occur in vacuum, at atmospheric pressure in air or another gaseous environment, or in any environment in between. The transfer may further be between materials deposition chambers in one location, which may or may not be interconnected in some way or may involve transporting the substrate and semiconductor layers between different locations, which is known as transport. Transport may be done with the substrate and semiconductor layers sealed under vacuum, surrounded by nitrogen or another gas, or surrounded by air. Additional semiconductor, insulating or other layers may be used as surface protection during transfer or transport, and removed after transfer or transport before further deposition.

A dilute nitride junction can be deposited in a first materials deposition chamber, and the (Al)(In)GaP and (Al)(In)GaAs junctions can be deposited in a second materials deposition chamber, with tunnel junctions formed between the junctions. A transfer occurs in the middle of the growth of one junction, such that the junction has one or more layers deposited in one materials deposition chamber and one or more layers deposited in a second materials deposition chamber.

To fabricate solar cells or photonic devices provided by the present disclosure, some or all of the layers of the dilute nitride active layers and the tunnel junctions can be deposited in one materials deposition chamber by molecular beam epitaxy (MBE), and the remaining layers of the solar cell can be deposited by chemical vapor deposition (CVD) in another materials deposition chamber. For example, a substrate can be placed in a first materials deposition chamber and layers that may include nucleation layers, buffer layers, emitter and window layers, contact layers and tunnel junctions can be grown on the substrate, followed by one or more dilute nitride junctions. If there is more than one dilute nitride junction, then a tunnel junction is grown between adjacent junctions. One or more tunnel junction layers may be grown, and then the substrate can be transferred to a second materials deposition chamber where the remaining solar cell layers are grown by chemical vapor deposition. In certain embodiments, the chemical vapor deposition system is a MOCVD system. In a related embodiment, a substrate is placed in a first materials deposition chamber and layers that may include nucleation layers, buffer layers, emitter and window layers, contact layers and a tunnel junction are grown on the substrate by chemical vapor deposition. Subsequently, the top junctions, two or more, are grown on the existing semiconductor layers, with tunnel junctions grown between the junctions. Part of the topmost dilute nitride junction, such as the window layer, may then be grown. The substrate is then transferred to a second materials deposition chamber where the remaining semiconductor layers of the topmost dilute nitride junction may be deposited, followed by up to three more dilute nitride junctions, with tunnel junctions between them.

A solar cell can be subjected to one or more thermal annealing treatments after growth. For example, a thermal annealing treatment includes the application of a temperature of 400° C. to 1,000° C. for between 10 microseconds and 10 hours. Thermal annealing may be performed in an atmosphere that includes air, nitrogen, arsenic, arsine, phosphorus, phosphine, hydrogen, forming gas, oxygen, helium, or any combination of the preceding materials. In certain embodiments, a stack of junctions and associated tunnel junctions may be annealed prior to fabrication of additional junctions.

Methods provided by the present disclosure include methods of forming the semiconductor device of claim 1, comprising: depositing the least one hydrogen diffusion barrier region overlying the dilute nitride active layer; and depositing at least one semiconductor layer overlying the at least one hydrogen diffusion barrier region, wherein the dilute nitride active layer and the at least one hydrogen diffusion barrier region are deposited using molecular beam epitaxy (MBE) and the at least one semiconductor layer is deposited using metal-organic chemical vapor deposition (MOCVD).

Methods provided by the present disclosure include methods for forming a semiconductor device comprising: depositing at least one hydrogen diffusion barrier region overlying a dilute nitride active layer; and depositing at least one semiconductor layer overlying the at least one hydrogen diffusion barrier region, wherein the dilute nitride active layer and the at least one hydrogen diffusion barrier region are deposited using molecular beam epitaxy (MBE) and the at least one semiconductor layer is deposited using metal-organic chemical vapor deposition (MOCVD), and wherein the dilute nitride active layer has a background doping concentration less than $10^{16}$ cm$^{-3}$.

While embodiments described herein are for photovoltaic cells comprising a dilute nitride active layer, the structures and methods described can also be used in photonic devices including solar cells, photodetectors, optical modulators and lasers; and electronic devices such as heterojunction bipolar transistors (HBT), a high-electron mobility transistors (HEMT), a pseudomorphic high-electron mobility transistors (PHEMT), and metal-semiconductor field-effect transistors (MESFET).

Aspects of the Invention

Aspect 1. A semiconductor device comprising a hydrogen diffusion barrier region overlying a dilute nitride active layer.

Aspect 2. The semiconductor device of aspect 1, wherein the hydrogen diffusion barrier region comprises a pseudomorphically strained layer.

Aspect 3. The semiconductor device of aspect 1, wherein the hydrogen diffusion barrier region comprises a doped semiconductor layer.

Aspect 4. The semiconductor device of aspects 1 to 3, wherein the hydrogen diffusion barrier region comprises AlGaAs, or AlGaAsSb, AlGaAsBi, AlInP, AlInGaP, AlInGaPSb, AlInGaPBi, AlInGaAs, AlInGaAsSb, AlInGaAsBi, AlN, AlNSb, and AlNBi.

Aspect 5. The semiconductor device of any one of aspects 1 to 4, wherein the hydrogen diffusion barrier region comprises AlGaAs.

Aspect 6. The semiconductor device of any one of aspects 1 to 3, wherein the hydrogen diffusion barrier comprises a nitrogen-containing layer.

Aspect 7. The semiconductor device of any one of aspects 1 to 3, wherein the hydrogen diffusion barrier region has a thickness within a range from 50 nm to 6 μm.

Aspect 8. The semiconductor device of any one of aspects 1 to 7, wherein the dilute nitride active layer comprises GaNAs, GaInNAs, GaInNAsSb, GaInNAsBi, GaInNAsSbBi, GaNAsSb, GaNAsBi or GaNAsSbBi.

Aspect 9. The semiconductor device of any one of aspects 1 to 8, wherein the dilute nitride active layer comprises GaAsN, AlGaAsN, GaInAsN, GaN, AlN, AlNSb, GaNSb, GaInNAsSb, GaNBi or AlNBi.

Aspect 10. The semiconductor device of any one of aspects 1 to 9, wherein the hydrogen diffusion barrier region and the dilute nitride active layer are grown by molecular beam epitaxy.

Aspect 11. The semiconductor device of any one of aspects 1 to 10, wherein, the semiconductor device comprises a plurality of semiconductor layers; and each of the plurality of semiconductor layers is substantially lattice matched or pseudomorphically strained to each of the other semiconductor layers.

Aspect 12. The semiconductor device of any one of aspects 1 to 11, wherein the semiconductor device comprises a multijunction solar cell.

Aspect 13. The semiconductor device of aspect 12, wherein the multijunction solar cell comprises: a substrate underlying the dilute nitride active layer; and one or more junctions overlying the hydrogen diffusion barrier region.

Aspect 14. The semiconductor device of aspect 13, wherein the substrate comprises GaAs, InP, GaSb, (Sn,Si)Ge, or silicon.

Aspect 15. The semiconductor device of any one of aspects 12 to 14, wherein each of the one or more junctions independently comprises AlInGaP or (Al)(In)GaAs.

Aspect 16. The semiconductor device of aspect 13, wherein, the substrate comprises (Sn,Si)Ge; the dilute nitride active layer comprises GaInNAsSb; and each of the one or more junctions independently comprises AlInGaP or InAlGaAs.

Aspect 17. The semiconductor device of any one of aspects 12 to 16, wherein each of the hydrogen diffusion barrier region, the dilute nitride active layer, the substrate, and the one or more second junctions, is substantially lattice matched or pseudomorphically strained to each other.

Aspect 18. The semiconductor device of any one of aspects 14 to 17, wherein, each of the dilute nitride active layer and the hydrogen diffusion barrier region is grown by molecular beam epitaxy; and each of the substrate and the one or more junctions is grown by metal-organic chemical vapor deposition.

Aspect 19. The semiconductor device of any one of aspects 12 to 18, wherein the multijunction solar cell is a four-junction multijunction solar cell, and is characterized by an open circuit voltage Voc greater than 3.0 V, a fill factor greater than 75%, a short circuit current density Jsc greater than 13 mA/cm$^2$, an efficiency greater than 25%, an Eg/q-Voc greater than 0.5, measured using a 1 sun AM1.5D source at a junction temperature of 25° C.

Aspect 20. A method of fabricating a semiconductor device comprising a dilute nitride active layer, comprising providing a substrate; growing a dilute nitride active layer overlying the substrate using molecular beam epitaxy; growing a hydrogen diffusion barrier region overlying the dilute nitride active layer using molecular beam epitaxy; applying a first thermal treatment to the substrate, the dilute nitride active layer, and the hydrogen diffusion barrier region; growing one or more semiconductor layers overlying the annealed hydrogen diffusion barrier region using metal-organic chemical vapor deposition; and applying a second thermal treatment to the substrate, the dilute nitride active layer, the hydrogen diffusion barrier region, and the one or more semiconductor layers.

Aspect 21. The method of aspect 20, wherein the first thermal treatment comprises rapid thermal annealing.

Aspect 22. The method of any one of aspects 20 to 21, wherein the rapid thermal annealing comprises applying a temperature within a range from 600° C. to 900° C. for a duration from 5 seconds to 3 hours.

Aspect 23. The method of any one of aspects 20 to 22, wherein the second thermal treatment comprises applying a temperature within a range from 400° C. to 1,000° C. for between 10 microseconds and 10 hours.

Aspect 24. The method of any one of aspects 20 to 23, wherein the dilute nitride active layer comprises GaNAs, GaInNAs, GaInNAsSb, GaInNAsBi, GaInNAsSbBi, GaNAsSb, GaNAsBi or GaNAsSbBi.

Aspect 25. The method of any one of aspects 20 to 24, wherein the dilute nitride active layer comprises GaInNAsSb.

Aspect 26. The method of any one of aspects 20 to 25, wherein each of the substrate, the dilute nitride active layer, the hydrogen diffusion barrier region, and the one or more semiconductor layers is substantially lattice matched to each of the other layers.

Aspect 27. The method of any one of aspects 20 to 26, wherein the semiconductor device comprises a multijunction solar cell.

Aspect 28. The method of any one of aspects 20 to 27, wherein, the substrate comprises GaAs, InP, GaSb, (Sn,Si)Ge, or silicon; the dilute nitride active layer comprises GaInNAsSb, GaInNAsBi, GaInNAsSbBi, GaNAsSb, GaNAsBi or GaNAsSbBi; and each of the one or more semiconductor layers independently comprises AlInGaP or (Al)(In)GaAs.

Aspect 29. The method of any one of aspects 20 to 28, wherein the substrate comprises GaAs, InP, GaSb, (Sn,Si)Ge, or silicon.

Aspect 30. The method of any one of aspects 20 to 29, wherein each of the one or more semiconductor layers independently comprises AlInGaP or (Al)(In)GaAs.

Aspect 31. The method of any one of aspects 20 to 30, wherein, the substrate comprises Ge; the dilute nitride active layer comprises GaInNAsSb; and each of the or more semiconductor layers independently comprises AlInGaP or InAlGaAs.

Aspect 32. The semiconductor device of any one of aspects 1 to 11, wherein the semiconductor device comprises a semiconductor laser.

Aspect 1A. A semiconductor device comprising a dilute nitride active layer, wherein the dilute nitride active layer comprises: a dilute nitride material selected from GaInNAsSb, GaInNAsBi, GaNAs, GaInNAs, GaInNAsSbBi, GaNAsSb, GaNAsBi, and GaNAsSbBi; a background doping concentration less than $5\times10^{16}$ cm$^{-3}$; and a hydrogen-induced defect density less than the background doping density; a hydrogen diffusion barrier region overlying the dilute nitride active layer, wherein the hydrogen diffusion barrier region comprises a doped semiconductor layer, a dilute nitride semiconductor layer, a strained semiconductor layer, or a combination of any of the foregoing; and one or more semiconductor layers overlying the hydrogen diffusion barrier region.

Aspect 2A. The semiconductor device of aspect 1A, wherein the hydrogen diffusion barrier region is adjacent the dilute nitride active layer, without any intervening semiconductor layers.

Aspect 3A. The semiconductor device of any one of aspects 1 to 2, wherein the hydrogen diffusion barrier region has a thickness within a range from 25 nm to 6 µm.

Aspect 4A. The semiconductor device of any one of aspects 1A to 2A, wherein the hydrogen diffusion barrier region comprises a doped semiconductor layer.

Aspect 5A. The semiconductor device of aspect 4A, wherein the doped semiconductor layer comprises a dopant selected from C, Be, Zn, Si, Se, Te, and a combination of any of the foregoing.

Aspect 6A. The semiconductor device of any one of aspects 4A to 5A, wherein the doped semiconductor layer comprises a doping level between $1\times10^{17}$ cm$^{-3}$ and $2\times10^{20}$ cm$^{-3}$.

Aspect 7A. The semiconductor device of any one of aspects 1 to 6, wherein the hydrogen diffusion barrier region comprises a dilute nitride semiconductor layer.

Aspect 8A. The semiconductor device of aspect 7A, wherein, the dilute nitride active layer comprises a first bandgap; the dilute nitride semiconductor layer comprises a second bandgap; and the second bandgap is larger than the first bandgap.

Aspect 9A. The semiconductor device of any one of aspects 7A to 8A, wherein the dilute nitride semiconductor layer comprises GaAsN, AlGaAsN, GaInAsN, GaN, AlN, AlNSb, GaNSb, GaInNAsSb, GaNBi or AlNBi.

Aspect 10A. The semiconductor device of any one of aspects 1A to 9A, wherein the hydrogen diffusion barrier region comprises a strained semiconductor layer.

Aspect 11A. The semiconductor device of aspect 10A, wherein, the semiconductor device further comprises a substrate underlying the dilute nitride active layer; and the strained semiconductor layer has strain within a range from +/−3.5% with respect to the substrate.

Aspect 12A. The semiconductor device of any one of aspects 10A to 11A, wherein the strained semiconductor layer is a strained superlattice structure (SLS).

Aspect 13A. The semiconductor device of any one of aspects 1A to 12A, wherein the hydrogen diffusion barrier region does not contain aluminum.

Aspect 14A. The semiconductor device of any one of aspects 1A to 13A, wherein each of the dilute nitride active layer and the hydrogen diffusion barrier region is grown by molecular beam epitaxy.

Aspect 15A. The semiconductor device of any one of aspects 1A to 14A, wherein the semiconductor layer adjacent the hydrogen diffusion barrier region is grown by MOCVD.

Aspect 16A. The semiconductor device of any one of aspects 1A to 15A, further comprising a hydrogen diffusion barrier region underlying the dilute nitride active layer.

Aspect 17A. The semiconductor device of any one of aspects 1A to 16A, wherein the semiconductor device comprises a solar cell comprising one or more junctions.

Aspect 18A. The semiconductor device of aspect 17A, wherein, the solar cell comprises a dilute nitride junction comprising a dilute nitride base layer; and the dilute nitride base layer comprises the dilute nitride active layer.

Aspect 19A. The semiconductor device of any one of aspects 17A to 18A, further comprising a substrate underlying the dilute nitride junction.

Aspect 20A. The semiconductor device of aspect 19A, wherein the substrate comprises GaAs, InP, GaSb, germanium, or silicon.

Aspect 21A. The semiconductor device of any one of aspects 19A to 20A, wherein the substrate comprises (Sn, Si)Ge; and the dilute nitride active layer comprises GaInNAsSb.

Aspect 22A. The semiconductor device of any one of aspects 19A to 21A, wherein each of the hydrogen diffusion barrier region, the substrate, and the one or more junctions, is substantially lattice matched to each other.

Aspect 23A. The semiconductor device of any one of aspects 19A to 22A, wherein, each of the dilute nitride active layer and the hydrogen diffusion barrier region is grown by molecular beam epitaxy; and each of the substrate and the semiconductor layer adjacent the hydrogen diffusion barrier region is grown by metal-organic chemical vapor deposition.

Aspect 24A. The semiconductor device of any one of aspects 17A to 23A, wherein, the solar cell comprises a plurality of semiconductor layers; and each of the plurality of semiconductor layers is substantially lattice matched to each of the other semiconductor layers.

Aspect 25A. The semiconductor device of any one of aspects 17A to 24A, wherein the solar cell comprises a multijunction solar cell.

Aspect 26A. The semiconductor device of aspect 25A, wherein the multijunction solar cell is a four-junction multijunction solar cell, and is characterized by an open circuit voltage Voc greater than 3.0 V, a fill factor greater than 75%, a short circuit current density Jsc greater than 13 mA/cm$^2$, an efficiency greater than 25%, an Eg/q-Voc greater than 0.5, measured using a 1 sun AM1.5D source at a junction temperature of 25° C.

Aspect 27A. The semiconductor device of any one of aspects 19A to 26A, wherein the semiconductor device comprises a solar cell, a vertical cavity surface emitting laser, a resonant cavity enhanced photodetector, an edge-emitting laser, a light emitting diode, a photodetector, an avalanche photodetector, or an optoelectronic modulator.

Aspect 28A. A method of fabricating a semiconductor device comprising a dilute nitride active layer, comprising: growing a dilute nitride active layer overlying a substrate using molecular beam epitaxy; growing a hydrogen diffusion barrier region overlying the dilute nitride active layer using molecular beam epitaxy; thermally annealing the substrate, the dilute nitride active layer, and the hydrogen diffusion barrier region; and growing a semiconductor layer adjacent the thermally annealed hydrogen diffusion barrier region using metal-organic chemical vapor deposition.

Aspect 29A. The method of aspect 28A, wherein growing a hydrogen diffusion barrier region comprises growing the hydrogen diffusion barrier region adjacent the dilute nitride active layer using molecular beam epitaxy.

Aspect 30A. The method of aspect 28A, wherein further comprising: after growing the dilute nitride active layer and before growing the hydrogen diffusion barrier region, growing one or more intervening semiconductor layers overlying the dilute nitride active layer using molecular beam epitaxy; and growing the hydrogen diffusion barrier region comprises growing the hydrogen diffusion barrier region adjacent an uppermost intervening semiconductor layer.

Aspect 31A. The method of any one of aspects 28A to 30A, wherein thermally annealing the substrate, the dilute nitride active layer, and the hydrogen diffusion barrier region comprises rapid thermal annealing.

Aspect 32A. The method of aspect 3A1, wherein the rapid thermal annealing comprises applying a temperature within a range from 600° C. to 900° C. for a duration from 5 seconds to 3 hours.

Aspect 33A. The method of any one of aspects 28A to 32A, wherein comprising, after growing the semiconductor layer, thermally annealing the substrate, the dilute nitride active layer, the hydrogen diffusion barrier region, and the semiconductor layer.

Aspect 34A. The method of aspect 33A, wherein thermally annealing the substrate, the dilute nitride active layer, the hydrogen diffusion barrier region, and the semiconductor layer comprises applying a temperature within a range from 400° C. to 1,000° C. for between 10 microseconds and 10 hours.

Aspect 35A. The method of any one of aspects 28A to 34A, wherein the dilute nitride active layer comprises GaNAs, GaInNAs, GaInNAsSb, GaInNAsBi, GaInNAsSbBi, GaNAsSb, GaNAsBi or GaNAsSbBi.

Aspect 36A. The method of any one of aspects 28A to 35A, wherein the dilute nitride active layer comprises GaInNAsSb.

Aspect 37A. The method of any one of aspects 28A to 37A, wherein each of the substrate, the dilute nitride active layer, the hydrogen diffusion barrier region, and the semiconductor layer is substantially lattice matched to each of the other layers.

Aspect 38A. The method of any one of aspects 28A to 38A, wherein, the semiconductor device comprises a multijunction solar cell comprising two or more junctions; and one of the junctions comprises a dilute nitride junction comprising the dilute nitride active layer.

Aspect 39A. The method of aspect 38A, wherein, the substrate comprises GaAs, InP, GaSb, (Sn,Si)Ge, or silicon; and the dilute nitride active layer comprises GaInNAsSb, GaInNAsBi, GaInNAsSbBi, GaNAsSb, GaNAsBi or GaNAsSbBi.

Aspect 40A. The method of any one of aspects 38 to 39, wherein the multijunction solar cell comprises a junction comprising an AlInGaP base layer and/or a junction comprising a (Al)(In)GaAs base layer overlying the hydrogen diffusion barrier region.

Aspect 41A. The method of any one of aspects 38A to 40A, wherein, the substrate comprises Ge; the dilute nitride active layer comprises GaInNAsSb; and the multijunction solar cell comprises a junction comprising an AlInGaP base layer and/or a junction comprising a (Al)(In)GaAs base layer overlying the hydrogen diffusion barrier region.

Aspect 42A. The method of any one of aspects 28A to 41A, wherein the semiconductor device comprises a solar cell, a vertical cavity surface emitting laser, a resonant cavity enhanced photodetector, an edge-emitting laser, a light emitting diode, a photodetector, an avalanche photodetector or an optoelectronic modulator.

It should be noted that there are alternative ways of implementing the embodiments disclosed herein. Accordingly, the present embodiments are to be considered as illustrative and not restrictive. Furthermore, the claims are not to be limited to the details given herein and are entitled their full scope and equivalents thereof.

What is claimed is:

1. A semiconductor device comprising:
    a dilute nitride active layer, wherein the dilute nitride active layer comprises:
        a dilute nitride material selected from GaNAs, GaInNAs, GaInNAsSb, GaInNAsBi, GaInNAsSbBi, GaNAsSb, GaNAsBi, and GaNAsSbBi;
        a background doping concentration less than $5 \times 10^{16}$ cm$^{-3}$; and
        a hydrogen-induced defect density less than the background doping density;
    a hydrogen diffusion barrier region overlying the dilute nitride active layer, wherein the hydrogen diffusion barrier region comprises a doped semiconductor layer, a dilute nitride semiconductor layer, a strained semiconductor layer, or a combination of any of the foregoing; and
    one or more semiconductor layers overlying the hydrogen diffusion barrier region.

2. The semiconductor device of claim 1, wherein the hydrogen diffusion barrier region is adjacent the dilute nitride active layer, without any intervening semiconductor layers.

3. The semiconductor device of claim 1, wherein the hydrogen diffusion barrier region comprises a doped semiconductor layer.

4. The semiconductor device of claim 3, wherein the doped semiconductor layer comprises a dopant selected from C, Be, Zn, Si, Se, Te, and a combination of any of the foregoing.

5. The semiconductor device of claim 3, wherein the doped semiconductor layer comprises a doping level between $1 \times 10^{17}$ cm$^{-3}$ and $2 \times 10^{20}$ cm$^{-3}$.

6. The semiconductor device of claim 1, wherein the hydrogen diffusion barrier region comprises a dilute nitride semiconductor layer.

7. The semiconductor device of claim 6, wherein,
    the dilute nitride active layer comprises a first bandgap;
    the dilute nitride semiconductor layer comprises a second bandgap; and
    the second bandgap is larger than the first bandgap.

8. The semiconductor device of claim 6, wherein the dilute nitride semiconductor layer comprises GaAsN, AlGaAsN, GaInAsN, GaN, AlN, AlNSb, GaNSb, GaInNAsSb, GaNBi or AlNBi.

9. The semiconductor device of claim 1, wherein the hydrogen diffusion barrier region comprises a strained semiconductor layer.

10. The semiconductor device of claim 9, wherein,
    the semiconductor device further comprises a substrate underlying the dilute nitride active layer; and
    the strained semiconductor layer has strain within a range from +/−3.5% with respect to the substrate.

11. The semiconductor device of claim 9, wherein the strained semiconductor layer is a strained superlattice structure (SLS).

12. The semiconductor device of claim 1, wherein the hydrogen diffusion barrier region does not contain aluminum.

13. The semiconductor device of claim 1, wherein each of the dilute nitride active layer and the hydrogen diffusion barrier region is grown by molecular beam epitaxy.

14. The semiconductor device of claim 1, wherein the semiconductor layer adjacent the hydrogen diffusion barrier region is grown by MOCVD.

15. The semiconductor device of claim 1, further comprising a hydrogen diffusion barrier region underlying the dilute nitride active layer.

16. The semiconductor device of claim 1, wherein the semiconductor device comprises a solar cell, a vertical cavity surface emitting laser, a resonant cavity enhanced photodetector, an edge-emitting laser, a light emitting diode, a photodetector, an avalanche photodetector, or an optoelectronic modulator.

* * * * *